United States Patent
Inaba et al.

(10) Patent No.: US 9,691,935 B2
(45) Date of Patent: Jun. 27, 2017

(54) IMPURITY-DIFFUSING COMPOSITION AND METHOD FOR PRODUCING SEMICONDUCTOR ELEMENT

(71) Applicant: TORAY INDUSTRIES, INC., Tokyo (JP)

(72) Inventors: Sachio Inaba, Otsu (JP); Seiichiro Murase, Otsu (JP); Hiroji Shimizu, Otsu (JP); Kouichi Dan, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/902,403

(22) PCT Filed: Jun. 30, 2014

(86) PCT No.: PCT/JP2014/067343
§ 371 (c)(1),
(2) Date: Dec. 31, 2015

(87) PCT Pub. No.: WO2015/002132
PCT Pub. Date: Jan. 8, 2015

(65) Prior Publication Data
US 2016/0372626 A1    Dec. 22, 2016

(30) Foreign Application Priority Data

Jul. 4, 2013 (JP) .................................. 2013-140375
Nov. 7, 2013 (JP) .................................. 2013-230879

(51) Int. Cl.
*H01L 31/18* (2006.01)
*H01L 31/068* (2012.01)
(Continued)

(52) U.S. Cl.
CPC .......... *H01L 31/1876* (2013.01); *C08G 77/08* (2013.01); *C09D 11/03* (2013.01);
(Continued)

(58) Field of Classification Search
CPC ............. H01L 31/1876; H01L 21/2225; H01L 21/2254; H01L 31/0682; H01L 31/103;
(Continued)

(56) References Cited

U.S. PATENT DOCUMENTS 6,695,903 B1   2/2004   Kubelbeck
2011/0108095 A1*   5/2011   Takahashi .............. C08G 77/04
        136/252

(Continued)

FOREIGN PATENT DOCUMENTS

JP   2002539615   11/2002
JP   2003168810   6/2003
(Continued)

OTHER PUBLICATIONS

International Search Report for International Application No. PCT/JP2014/067343 mailed Sep. 30, 2014.

*Primary Examiner* — Karen Kusumakar
(74) *Attorney, Agent, or Firm* — RatnerPrestia

(57) ABSTRACT

An impurity-diffusing composition including (A) a polysiloxane represented by Formula (1) and (B) an impurity diffusion component.

(1)

(Continued)

(a)

(b)

(c)

In the formula, $R^1$ represents an aryl group having 6 to 15 carbon atoms, and a plurality of $R^1$ may be the same or different. $R^2$ represents any of a hydroxyl group, an alkyl group having 1 to 6 carbon atoms, an alkoxy group having 1 to 6 carbon atoms, an alkenyl group having 2 to 10 carbon atoms, an acyl group having 2 to 6 carbon atoms, and an aryl group having 6 to 15 carbon atoms, and a plurality of $R^2$ may be the same or different. $R^3$ and $R^4$ each represent any of a hydroxyl group, an alkyl group having 1 to 6 carbon atoms, an alkoxy group having 1 to 6 carbon atoms, an alkenyl group having 2 to 10 carbon atoms, and an acyl group having 2 to 6 carbon atoms, and a plurality of $R^3$ and a plurality of $R^4$ each may be the same or different. The ratio of n:m is 95:5 to 25:75.

10 Claims, 7 Drawing Sheets

(51) Int. Cl.
| | | |
|---|---|---|
| *H01L 21/22* | (2006.01) | |
| *H01L 21/225* | (2006.01) | |
| *H01L 31/103* | (2006.01) | |
| *C09D 183/04* | (2006.01) | |
| *C08G 77/08* | (2006.01) | |
| *C09D 11/03* | (2014.01) | |
| *C09D 11/102* | (2014.01) | |
| *C09D 11/52* | (2014.01) | |
| C08G 77/00 | (2006.01) | |
| C08K 3/32 | (2006.01) | |
| C08K 3/36 | (2006.01) | |

(52) U.S. Cl.
CPC ............ *C09D 11/102* (2013.01); *C09D 11/52* (2013.01); *C09D 183/04* (2013.01); *H01L 21/2225* (2013.01); *H01L 21/2254* (2013.01); *H01L 31/0682* (2013.01); *H01L 31/103* (2013.01); *H01L 31/1804* (2013.01); *H01L 31/1864* (2013.01); *C08G 77/80* (2013.01); *C08K 3/32* (2013.01); *C08K 3/36* (2013.01); *C08K 2003/329* (2013.01); *Y02E 10/547* (2013.01); *Y02P 70/521* (2015.11)

(58) Field of Classification Search
CPC . H01L 31/1804; H01L 31/1864; C08G 77/08; C08G 77/80; C09D 11/03; C09D 11/102; C09D 11/52; C09D 183/04
See application file for complete search history.

(56) References Cited

U.S. PATENT DOCUMENTS

| | | |
|---|---|---|
| 2012/0132109 A1 | 5/2012 | Morita |
| 2013/0281592 A1 | 10/2013 | Kamizono |
| 2014/0030839 A1 | 1/2014 | Kamizono |

FOREIGN PATENT DOCUMENTS

| | | |
|---|---|---|
| JP | 2010034414 | 2/2010 |
| JP | 2011116953 | 6/2011 |
| JP | 2012114298 | 6/2012 |
| JP | 2012126892 | 7/2012 |
| JP | 2013125911 | 6/2013 |
| JP | 2013229391 | 11/2013 |
| JP | 2014042001 | 3/2014 |
| JP | 2014168026 | 9/2014 |
| WO | 2012105163 | 8/2012 |

\* cited by examiner

[Figure 1]
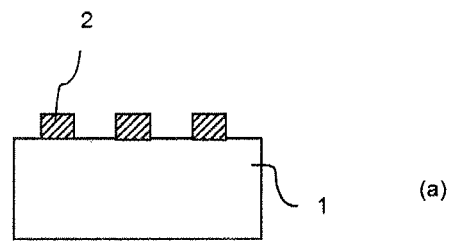
(a)
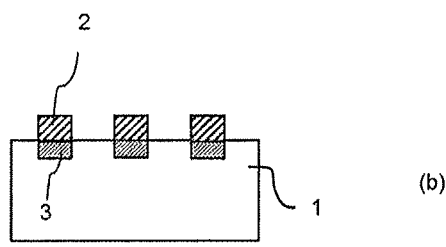
(b)
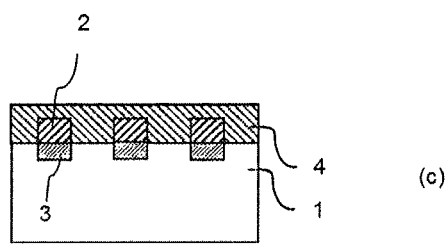
(c)
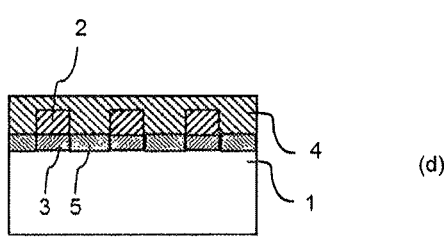
(d)
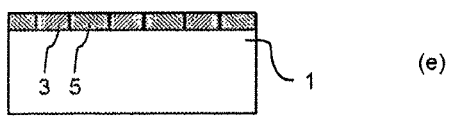
(e)

[Figure 2]
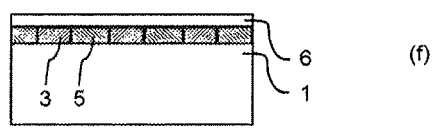
(f)
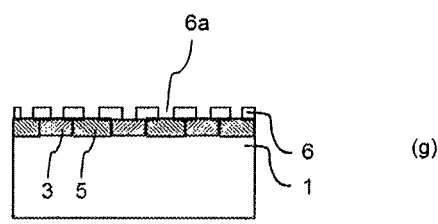
(g)
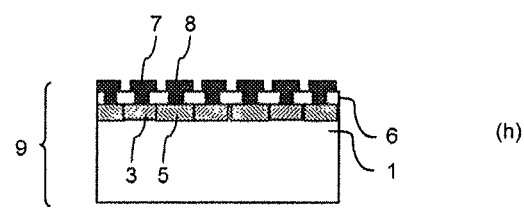
(h)

[Figure 3]
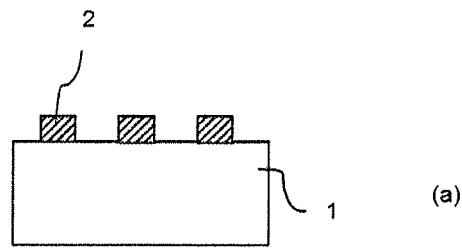
(a)
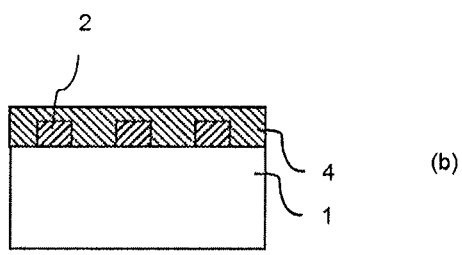
(b)
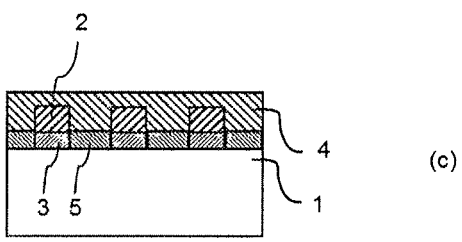
(c)
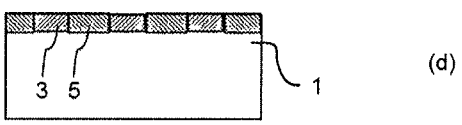
(d)

[Figure 4]
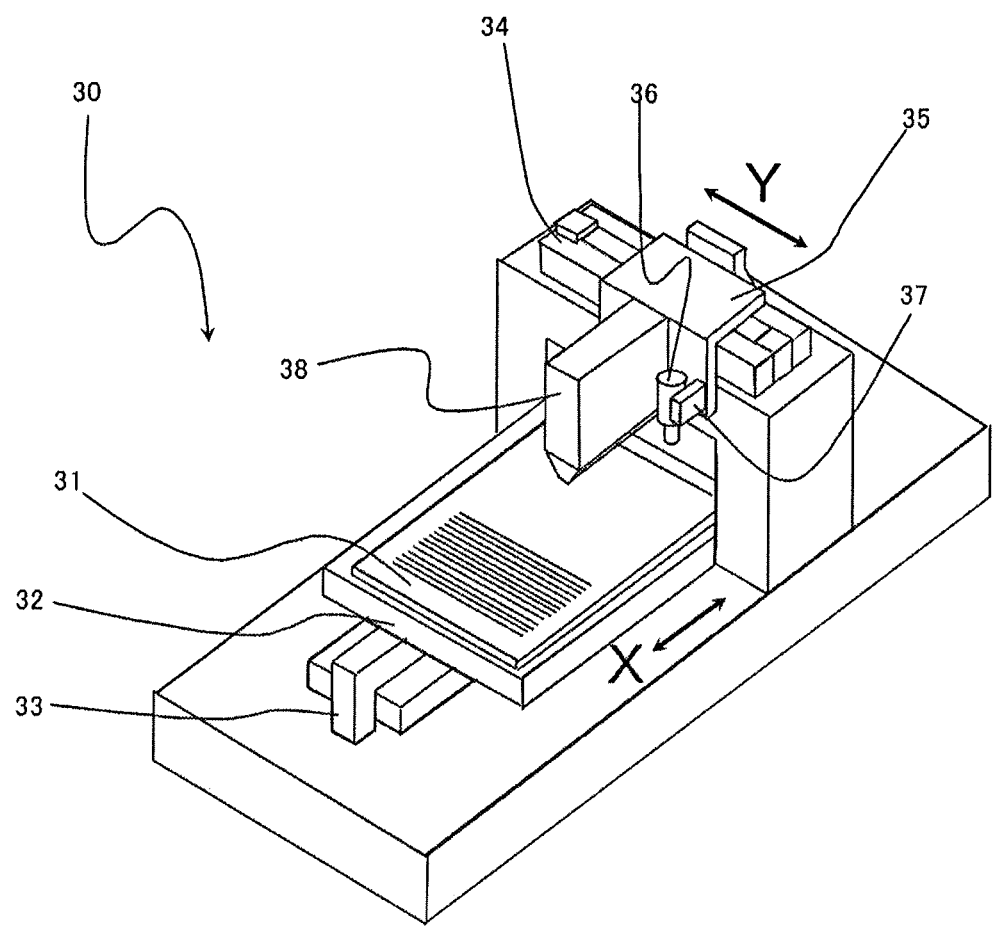

[Figure 5]
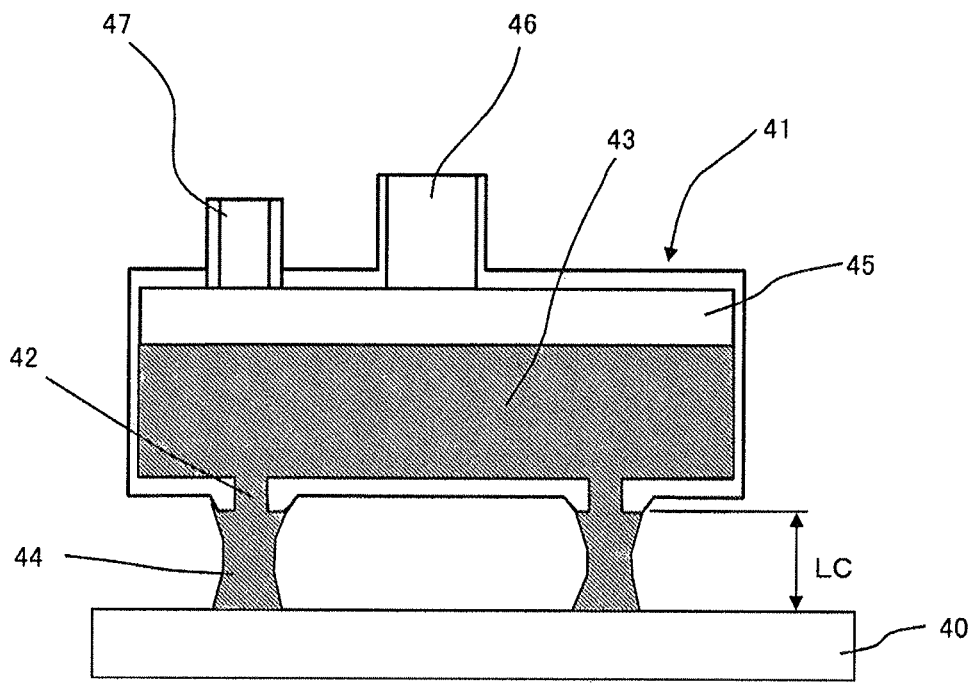

[Figure 6]
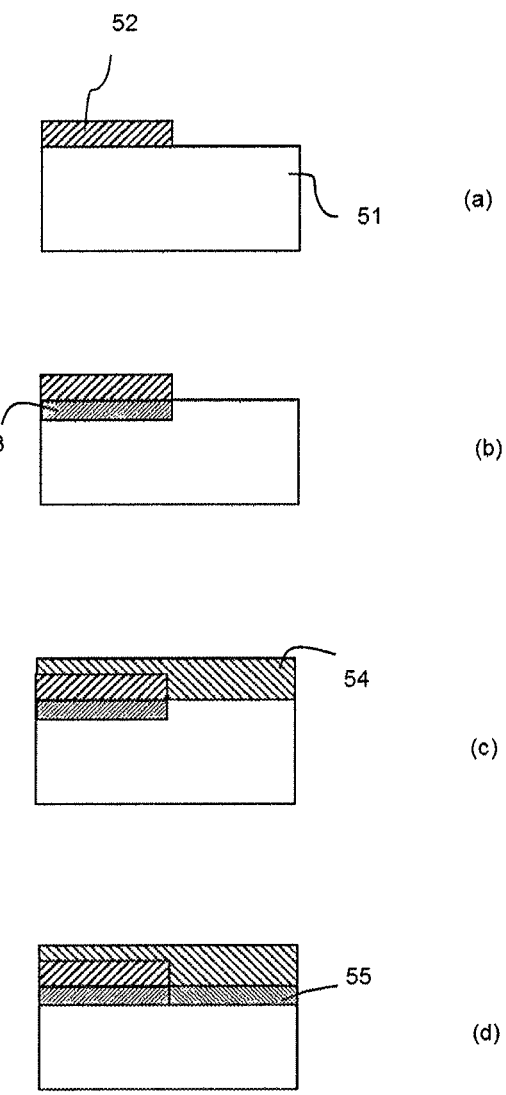

[Figure 7]
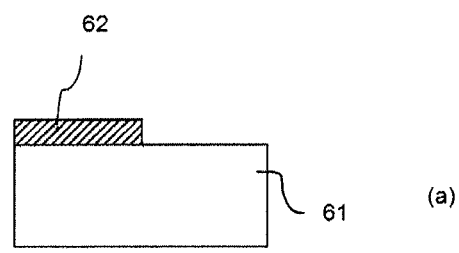
(a)
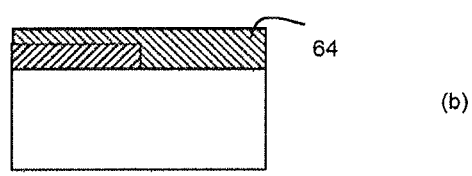
(b)
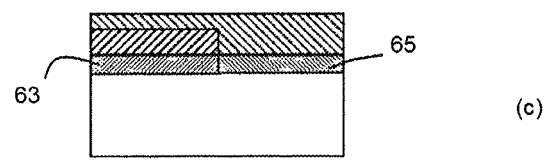
(c)

IMPURITY-DIFFUSING COMPOSITION AND METHOD FOR PRODUCING SEMICONDUCTOR ELEMENT

CROSS REFERENCE TO RELATED APPLICATIONS

This is the U.S. National Phase application of PCT/JP2014/067343, filed Jun. 30, 2014, which claims priority to Japanese Patent Application No. 2013-140375, filed Jul. 4, 2013, and Japanese Patent Application No. 2013-230879, filed Nov. 7, 2013, the disclosures of each of these applications being incorporated herein by reference in their entireties for all purposes.

TECHNICAL FIELD OF THE INVENTION

The present invention relates to a impurity-diffusing composition for diffusing impurities into a semiconductor substrate, and a method of manufacturing a semiconductor device.

BACKGROUND OF THE INVENTION

In the current production of solar cells, when an n-type or p-type impurity diffusion layer is formed in a semiconductor substrate, a method is used in which a diffusion source is formed on the substrate, and impurities are diffused into the semiconductor substrate by thermal diffusion. The diffusion source is formed by chemical vapor deposition (CVD) or solution coating of a liquid impurity-diffusing composition. When a liquid impurity-diffusing composition is used, for example, a thermally oxidized film is first formed on a semiconductor substrate surface, and then a resist having a predetermined pattern is laminated to the thermally oxidized film by photolithography. Using the resist as a mask, parts of the thermally oxidized film not masked by the resist are etched by an acid or alkali, and the resist is removed to form a mask of the thermally oxidized film. Subsequently, an n-type or p-type diffusion composition is applied to attach the diffusion composition to openings of the mask. Thereafter, impurity components in the composition are thermally diffused into the semiconductor substrate at 600 to 1250° C. to form an n-type or p-type impurity diffusion layer.

PATENT DOCUMENTS

For such production of solar cells, it has recently been studied to produce solar cells at low cost by forming an impurity diffusion layer region in a pattern by a simple method such as a printing method without using the conventional photolithographic technique (see, for example, Patent Document 1). The printing method, in which a resist is not used, and a diffusion agent is discharged directly and selectively onto a doping layer-forming region to form a pattern, does not require a complicated process and can also reduce the amount of liquid used, as compared to the conventional photolithography.

As a component of an impurity diffusion agent suitable for the printing method, polysiloxane is known (see, for example, Patent Documents 2 to 3).

Patent Document 1: JP 2003-168810 W
Patent Document 2: JP 2002-539615 W
Patent Document 3: JP 2012-114298 A

SUMMARY OF THE INVENTION

However, impurity diffusion agents of the prior art have a drawback in that their crack resistances are low. Although it has been reported that the crack resistance of a thin film for inkjet use is improved, a thick film formed by using lower-cost printing such as screen printing would be unfortunately cracked.

The present inventors studied a method in which n-type impurities are diffused using an n-type impurity diffusion layer, and then the n-type impurity diffusion layer after diffusion is used as a mask for p-type impurity diffusion. However, it was found that an n-type impurity diffusion layer of the prior art was thin or porous and, therefore, had poor masking properties for other impurity diffusion agents.

In screen printing, a thickener is usually added to control the viscosity, but disadvantageously, pyrolysis of the thickener causes voids to result in a porous membrane, reducing masking properties, and moreover, the likelihood to be affected by the atmospheric gas at impurity diffusion is high.

The present invention is made in view of the circumstances described above and aims to provide a impurity-diffusing composition that is excellent in printability on a semiconductor substrate and impurity diffusibility thereinto, less prone to cracks during the process of diffusion, and less likely to be affected by the atmosphere at the diffusion. It is also an object of the present invention is to provide a impurity-diffusing composition that is formed, after diffusion, into a film having sufficient masking properties for other impurity diffusion agents.

To solve the problems described above, the impurity-diffusing composition of the present invention includes the following embodiment:

A impurity-diffusing composition comprising (A) a polysiloxane represented by Formula (1) and (B) an impurity diffusion component.

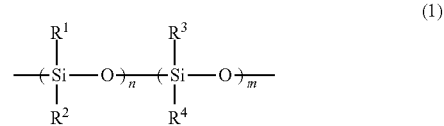

In the formula, $R^1$ represents an aryl group having 6 to 15 carbon atoms, and a plurality of $R^1$ may be the same or different. $R^2$ represents any of a hydroxyl group, an alkyl group having 1 to 6 carbon atoms, an alkoxy group having 1 to 6 carbon atoms, an acyloxy group having 1 to 6 carbon atoms, an alkenyl group having 2 to 10 carbon atoms, and an aryl group having 6 to 15 carbon atoms, and a plurality of $R^2$ may be the same or different. $R^3$ and $R^4$ each represent any of a hydroxyl group, an alkyl group having 1 to 6 carbon atoms, an alkoxy group having 1 to 6 carbon atoms, an acyloxy group having 1 to 6 carbon atoms, and an alkenyl group having 2 to 10 carbon atoms, and a plurality of $R^3$ and a plurality of $R^4$ each may be the same or different. The ratio of n:m is 95:5 to 25:75.

The method of manufacturing a semiconductor device according to the present invention includes the following embodiment:

A method of manufacturing a semiconductor device, comprising the steps of printing the impurity-diffusing composition on a semiconductor substrate to form a impurity-diffusing layer film, and diffusing impurities from the impurity-diffusing layer film to form an impurity diffusion layer.

In the impurity-diffusing composition of the present invention, it is preferred that $R^2$ and $R^4$ each represent any of a hydroxyl group, an alkoxy group having 1 to 6 carbon atoms, and an acyloxy group having 1 to 6 carbon atoms, and R³ be an alkyl group having 1 to 4 carbon atoms or an alkenyl group having 2 to 4 carbon atoms.

In the impurity-diffusing composition of the present invention, the ratio of n:m is preferably 80:20 to 40:60.

In the impurity-diffusing composition of the present invention, (A) the polysiloxane preferably has a 20% pyrolysis temperature of 550° C. or higher.

The impurity-diffusing composition of the present invention preferably further comprises (C) a thickener in an amount of 3% by weight to 20% by weight based on the amount of the composition.

The impurity-diffusing composition of the present invention is preferably applied onto a semiconductor substrate by printing to form a diffusion layer on the substrate.

In the impurity-diffusing composition of the present invention, the printing is preferably screen printing.

In the method of manufacturing a semiconductor device according to the present invention, the impurity-diffusing composition film is preferably a pattern of the impurity-diffusing t composition.

In the method of manufacturing a semiconductor device according to the present invention, the printing is preferably screen printing.

The present invention provides a impurity-diffusing composition that is excellent in printability on a substrate and impurity diffusibility thereinto, less prone to cracks during the process of firing and diffusion, and less likely to be affected by the atmosphere at the diffusion. The impurity-diffusing composition of the present invention can also be used as a masking material for other impurity diffusion agents.

BRIEF DESCRIPTION OF THE DRAWINGS

FIG. 1 is a cross-sectional process view illustrating one example of the method of forming an impurity diffusion layer using the impurity-diffusing composition of the present invention;

FIG. 2 is a cross-sectional process view illustrating one example of the method of manufacturing an interdigitated back-contact solar cell using the impurity-diffusing composition of the present invention;

FIG. 3 is a cross-sectional process view illustrating another example of the method of forming an impurity diffusion layer using the impurity-diffusing composition of the present invention;

FIG. 4 is a schematic view of a stripe coating apparatus that can be used for application of the impurity-diffusing composition of the present invention;

FIG. 5 is a cross-sectional view of the stripe coating apparatus that can be used for application of the impurity-diffusing composition of the present invention;

FIG. 6 is a cross-sectional process view illustrating another example of the method of forming an impurity diffusion layer using the impurity-diffusing composition of the present invention; and FIG. 7 is a cross-sectional process view illustrating another example of the method of forming an impurity diffusion layer using the impurity-diffusing composition of the present invention.

DETAILED DESCRIPTION OF EMBODIMENTS OF THE INVENTION

The impurity-diffusing composition of an embodiment of the present invention includes (A) a polysiloxane represented by Formula (1) and (B) an impurity diffusion component. Hereinafter, exemplary components contained in the impurity-diffusing composition of the present invention will be described in detail.

(A) Polysiloxane Represented by Formula (1)

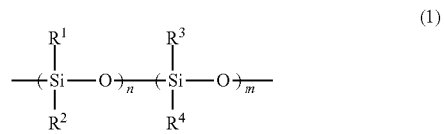

In the formula, R¹ represents an aryl group having 6 to 15 carbon atoms, and a plurality of R¹ may be the same or different. R² represents any of a hydroxyl group, an alkyl group having 1 to 6 carbon atoms, an alkoxy group having 1 to 6 carbon atoms, an acyloxy group having 1 to 6 carbon atoms, an alkenyl group having 2 to 10 carbon atoms, and an aryl group having 6 to 15 carbon atoms, and a plurality of R² may be the same or different. R³ and R⁴ each represent any of a hydroxyl group, an alkyl group having 1 to 6 carbon atoms, an alkoxy group having 1 to 6 carbon atoms, an acyloxy group having 1 to 6 carbon atoms, and an alkenyl group having 2 to 10 carbon atoms, and a plurality of R³ and a plurality of R⁴ each may be the same or different. The ratio of n:m is 95:5 to 25:75.

In other words, the polysiloxane represented by Formula (1) is a polysiloxane containing a unit including at least one aryl group having 6 to 15 carbon atoms in an amount of 25 to 95 mol % in terms of Si atoms. The terminal group is any of hydrogen, a hydroxyl group, an alkyl group having 1 to 6 carbon atoms, an alkoxy group having 1 to 6 carbon atoms, an acyloxy group having 1 to 6 carbon atoms, and an alkenyl group having 2 to 10 carbon atoms.

"The number of carbon atoms" herein refers to the total number of carbon atoms in a group including substituents in the group. For example, the number of carbon atoms in a butyl group substituted with a methoxy group is 5. The polysiloxane represented by Formula (1) may be a block copolymer or a random copolymer as long as it contains each unit at the ratio described above.

When the unit including at least one aryl group having 6 to 15 carbon atoms is contained in the polysiloxane in an amount of 25 mol % or more in terms of Si atoms, the crosslink density of polysiloxane backbones will not be too high, and cracks are prevented more effectively even when the impurity-diffusing composition is thickly formed. As a result of this, cracks are less likely to occur during the process of firing and thermal diffusion, and, therefore, the stability in impurity diffusion can be improved. After the thermal diffusion of impurities, the resulting impurity diffusion layer can be utilized as a mask for other impurity diffusion agents. To provide masking properties, the layer thickness after diffusion is preferably as large as possible, and the impurity-diffusing composition of the present invention, which is less prone to cracks even when thickly formed, is suitable for use. When a pyrolytic component such as a thickener is added to the composition, voids formed by pyrolysis can be filled by the reflow effect due to siloxane, and a dense film with few voids can be formed. Thus, the composition is less likely to be affected by the atmosphere at diffusion and provided with high masking properties for other impurities.

When the amount of the unit including at least one aryl group in the polysiloxane is not more than 95 mol % in terms of Si atoms, the residue after removal after diffusion can be eliminated. The residue, which is considered to be carbide remained after incomplete decomposition and volatilization of organic matter, not only impairs doping properties but also increases the contact resistance to electrodes formed afterwards to cause a reduction in solar cell efficiency. When the amount of the unit including at least one aryl group is more than 95 mol %, the composition film becomes too dense before organic components are completely decomposed and volatilized, and residues are likely to build up.

To improve crack resistance, masking properties, and storage stability, and reduce the influence of a diffusion atmosphere, the amount of the unit including at least one aryl group having 6 to 15 carbon atoms in the polysiloxane contained in the impurity-diffusing composition is more preferably 35 mol % or more, still more preferably 40 mol % or more. Furthermore, to prevent residue buildup without being affected by the atmosphere or the film thickness, the amount of the unit including at least one aryl group is preferably 80 mol % or less. In other words, the ratio of n:m is particularly preferably 80:20 to 40:60. When $R^2$ to $R^4$ are alkyl groups and the number of carbon atoms is 6 or less, residue buildup can be prevented, and also the reflow effect due to the aryl group of $R^1$ can be sufficiently produced.

For $R^1$ in Formula (1), the aryl group having 6 to 15 carbon atoms may be unsubstituted or substituted and can be selected according to the properties of the composition. Specific examples of the aryl group having 6 to 15 carbon atoms include phenyl, p-tolyl, m-tolyl, o-tolyl, p-hydroxyphenyl, p-styryl, p-methoxyphenyl, and naphthyl, and phenyl, p-tolyl, and m-tolyl are particularly preferred.

For $R^2$ in Formula (1), the alkyl group having 1 to 6 carbon atoms, the alkoxy group having 1 to 6 carbon atoms, the acyloxy group having 1 to 6 carbon atoms, the alkenyl group having 2 to 10 carbon atoms, and the aryl group having 6 to 15 carbon atoms each may be unsubstituted or substituted and can be selected according to the properties of the composition.

Specific examples of the alkyl group having 1 to 6 carbon atoms include methyl, ethyl, n-propyl, isopropyl, n-butyl, t-butyl, n-hexyl, trifluoromethyl, 3,3,3-trifluoropropyl, 3-methoxy-n-propyl, glycidyl, 3-glycidoxypropyl, 3-aminopropyl, 3-mercaptopropyl, and 3-isocyanatepropyl, and in terms of residues, methyl, ethyl, n-propyl, isopropyl, n-butyl, and t-butyl, each having 4 or less carbon atoms, are preferred.

Specific examples of the alkoxy group having 1 to 6 carbon atoms include methoxy, ethoxy, n-propoxy, isopropoxy, n-butoxy, and t-butoxy.

Specific examples of the alkenyl group having 2 to 10 carbon atoms include vinyl, 1-propenyl, 1-butenyl, 2-methyl-1-propenyl, 1,3-butanedienyl, 3-methoxy-1-propenyl, 3-acryloxypropyl, and 3-methacryloxypropyl, and in terms of residues, vinyl, 1-propenyl, 1-butenyl, 2-methyl-1-propenyl, 1,3-butanedienyl, and 3-methoxy-1-propenyl, each having 4 or less carbon atoms, are particularly preferred.

Specific examples of the acyloxy group having 1 to 6 carbon atoms include acetoxy, propionyloxy, acryloyloxy, and benzoyloxy.

Specific examples of the aryl group having 6 to 15 carbon atoms include the same groups as exemplified for $R^1$.

For $R^3$ and $R^4$ in Formula (1), the alkyl group having 1 to 6 carbon atoms, the alkoxy group having 1 to 6 carbon atoms, and the alkenyl group having 2 to 10 carbon atoms each may be unsubstituted or substituted and can be selected according to the properties of the composition. Specific examples thereof include the same groups as exemplified for $R^2$.

To form a film that is denser and has higher crack resistance, it is preferred that $R^2$ and $R^4$ each represent any of a hydroxyl group, an alkoxy group having 1 to 6 carbon atoms, and an acyloxy group having 1 to 6 carbon atoms, and $R^3$ be an alkyl group having 1 to 4 carbon atoms or an alkenyl group having 2 to 4 carbon atoms. In other words, it is preferred that all the constitutional units in the polysiloxane be trifunctional organosilane.

The polysiloxane (A) of the present invention preferably has a 20% pyrolysis temperature of 550° C. or higher. If this is the case, the reflow effect due to siloxane is produced after organic components other than the polysiloxane are completely removed by pyrolysis, and, consequently, a denser film with less residue is obtained. "20% pyrolysis temperature" herein refers to a temperature at which the weight of polysiloxane decreases through pyrolysis by 20%. The pyrolysis temperature can be measured using, for example, thermogravimetric analysis (TGA).

Specific preferred examples of the organosilane constituting the unit including $R^1$ and $R^2$ in Formula (1) include phenyltrimethoxysilane, phenyltriethoxysilane, p-hydroxyphenyltrimethoxysilane, p-tolyltrimethoxysilane, p-styryltrimethoxysilane, p-methoxyphenyltrimethoxysilane, diphenyldimethoxysilane, methylphenyldimethoxysilane, 1-naphthyltrimethoxysilane, 2-naphthyltrimethoxysilane, 1-naphthyltriethoxysilane, and 2-naphthyltriethoxysilane. Of these, phenyltrimethoxysilane, p-tolyltrimethoxysilane, and p-methoxyphenyltrimethoxysilane are particularly preferred.

Specific examples of the organosilane constituting the unit including $R^3$ and $R^4$ in Formula (1) include tetrafunctional silanes such as tetramethoxysilane, tetraethoxysilane, and tetraacetoxysilane; trifunctional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, glycidyl trimethoxysilane, vinyltrimethoxysilane, vinyltriethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, and 3-mercaptopropyltrimethoxysilane; and bifunctional silanes such as dimethyldimethoxysilane, dimethyldiethoxysilane, dimethyldiacetoxysilane, and di(n-butyl)dimethoxysilane. These organosilanes may be used alone or in combination of two or more. Of these organosilanes, trifunctional silanes are preferred in terms of film density, crack resistance, residues, and cure rate.

The polysiloxane (A) represented by Formula (1) can be produced by hydrolyzing an organosilane compound, and then condensing the hydrolysate in the presence or absence of a solvent. Conditions of the hydrolysis reaction, such as acid concentration, reaction temperature, and reaction time, can be selected as appropriate in view of, for example, the scale of the reaction and the size and shape of a reaction vessel. For example, it is preferable to add an acid catalyst and water to an organosilane compound in a solvent over 1 to 180 minutes, and then allow the compound to react at room temperature to 110° C. for 1 to 180 minutes. When the hydrolysis reaction is carried out under such conditions, a sudden reaction can be prevented. The reaction temperature is more preferably 30 to 130° C.

The hydrolysis reaction is preferably carried out in the presence of an acid catalyst. Examples of acid catalysts include inorganic hydrohalic acids such as hydrochloric acid, hydrobromic acid, and hydriodic acid; other inorganic acids such as sulfuric acid, nitric acid, phosphoric acid, hexafluorophosphoric acid, hexafluoroantimonic acid, boric acid, tetrafluoroboric acid, and chromic acid; sulfonic acids such as methanesulfonic acid, ethanesulfonic acid, benzenesulfonic acid, p-toluenesulfonic acid, and trifluoromethanesulfonic acid; and carboxylic acids such as acetic acid, citric acid, formic acid, gluconic acid, lactic acid, oxalic acid, tartaric acid, pyruvic acid, citric acid, succinic acid, fumaric acid, and malic acid. The acid catalyst for use in the present invention, from the viewpoint of doping properties, preferably contains atoms other than silicon, hydrogen, carbon, oxygen, nitrogen, and phosphorus as little as possible, and is preferably phosphoric acid, formic acid, acetic acid, or a carboxylic acid-based acid catalyst. Phosphoric acid is particularly preferred.

A preferred amount of the acid catalyst is 0.1 part by weight to 5 parts by weight based on 100 parts by weight of the total amount of the organosilane compound used in the hydrolysis reaction. When the amount of the acid catalyst is in this range, the hydrolysis reaction can be easily controlled to proceed to a necessary and sufficient extent.

The solvent used for the hydrolysis reaction of the organosilane compound and the condensation reaction of the resulting hydrolysate may be any solvent, and can be selected as appropriate in view of the properties of the resin composition, such as stability, spreadability, and volatility. Two or more solvents may be used in combination, or the reaction may be carried out without a solvent. Specific examples of solvents include alcohols such as methanol, ethanol, propanol, isopropanol, butanol, isobutanol, t-butanol, 1-methoxy-2-propanol, pentanol, 4-methyl-2-pentanol, 3-methyl-2-butanol, 3-methyl-3-methoxy-1-butanol, 1-t-butoxy-2-propanol, and diacetone alcohol; glycols such as ethylene glycol and propylene glycol; ethers such as ethylene glycol monomethyl ether, ethylene glycol monoethyl ether, propylene glycol monomethyl ether, propylene glycol monoethyl ether, propylene glycol monopropyl ether, propylene glycol t-butyl ether, propylene glycol n-butyl ether, ethylene glycol dimethyl ether, ethylene glycol diethyl ether, ethylene glycol dibutyl ether, diethyl ether, diethylene glycol methyl ethyl ether, dipropylene glycol-n-butyl ether, dipropylene glycol monomethyl ether, diisopropyl ether, di-n-butyl ether, diphenyl ether, diethylene glycol ethyl methyl ether, diethylene glycol dimethyl ether, and ethylene glycol monobutyl ether; ketones such as methyl ethyl ketone, acetylacetone, methyl propyl ketone, methyl butyl ketone, methyl isobutyl ketone, diisobutyl ketone, cyclopentanone, 2-heptanone, diisobutyl ketone, cyclohexanone, and cycloheptanone; amides such as dimethylformamide and dimethylacetamide; acetates such as isopropyl acetate, ethyl acetate, propyl acetate, butyl acetate, n-propyl acetate, isopropyl acetate, n-butyl acetate, isobutyl acetate, ethyl acetoacetate, ethylene glycol monomethyl ether acetate, ethylene glycol monoethyl ether acetate, diethylene glycol monoethyl ether acetate, propylene glycol monomethyl ether acetate, 3-methoxybutyl acetate, 3-methyl-3-methoxybutyl acetate, butyl diglycol acetate, 1,3-butylene glycol diacetate, ethyl diglycol acetate, dipropylene glycol methyl ether acetate, methyl lactate, ethyl lactate, butyl lactate, and triacetyl glycerin; aromatic or aliphatic hydrocarbons such as toluene, xylenes, hexane, cyclohexane, ethyl benzoate, naphthalene, and 1,2,3,4-tetrahydronaphthalene; and γ-butyrolactone, N-methyl-2-pyrrolidone, N,N-dimethylimidazolidinone, dimethyl sulfoxide, and propylene carbonate.

In the present invention, in terms of solubility and printability, preferred are diethylene glycol methyl ethyl ether (boiling point: 176° C.), ethylene glycol monoethyl ether acetate (boiling point: 156.4° C.), ethylene glycol monomethyl ether acetate (boiling point: 145° C.), methyl lactate (boiling point: 145° C.), ethyl lactate (boiling point: 155° C.), diacetone alcohol (boiling point: 169° C.), propylene glycol monomethyl ether acetate (boiling point: 145° C.), 3-methoxy-3-methyl-1-butanol (boiling point: 174° C.), dipropylene glycol monomethyl ether (boiling point: 188° C.), dipropylene glycol-n-butyl ether (boiling point: 229° C.), γ-butyrolactone (boiling point: 204° C.), diethylene glycol monoethyl ether acetate (boiling point: 217° C.), butyl diglycol acetate (boiling point: 246° C.), ethyl acetoacetate (boiling point: 181° C.), N-methyl-2-pyrrolidone (boiling point: 204° C.), N,N-dimethylimidazolidinone (boiling point: 226° C.), dipropylene glycol methyl ether acetate (boiling point: 213° C.), 1,3-butylene glycol diacetate (boiling point: 232° C.), diisobutyl ketone (boiling point: 168° C.), propylene glycol t-butyl ether (boiling point: 151° C.), and propylene glycol n-butyl ether (boiling point: 170° C.).

When a solvent is formed through the hydrolysis reaction, the hydrolyzation can be carried out without a solvent. After completion of the reaction, it is also preferable to further add a solvent to adjust the concentration to be appropriate for the resin composition. After the hydrolysis, it is also possible, depending on the purpose, to distill off an appropriate amount of products such as alcohols under heating and/or reduced pressure, and then add a suitable solvent.

The amount of the solvent used in the hydrolysis reaction is preferably 80 parts by weight to 500 parts by weight based on 100 parts by weight of the total amount of the organosilane compound. When the amount of the solvent is in this range, the hydrolysis reaction can be easily controlled to proceed to a necessary and sufficient extent. The water used for the hydrolysis reaction is preferably ion-exchanged water. The amount of the water used can be freely selected, and is preferably in the range of 1.0 to 4.0 mol based on 1 mol of Si atom.

(B) Impurity Diffusion Component

In the impurity-diffusing composition of the present invention, the impurity diffusion component is a component for forming an impurity diffusion layer in a semiconductor substrate. The impurity diffusion component of n-type is preferably a compound containing a Group 15 element, and particularly preferably a phosphorus compound. The impurity diffusion component of p-type is preferably a compound containing a Group 13 element, and particularly preferably a boron compound.

Examples of phosphorus compounds include diphosphorus pentaoxide; phosphoric acid; polyphosphoric acid; phosphates such as methyl phosphate, dimethyl phosphate, trimethyl phosphate, ethyl phosphate, diethyl phosphate, triethyl phosphate, propyl phosphate, dipropyl phosphate, tripropyl phosphate, butyl phosphate, dibutyl phosphate, tributyl phosphate, phenyl phosphate, diphenyl phosphate, and triphenyl phosphate; and phosphites such as methyl phosphite, dimethyl phosphite, trimethyl phosphite, ethyl phosphite, diethyl phosphite, triethyl phosphite, propyl phosphite, dipropyl phosphite, tripropyl phosphite, butyl phosphite, dibutyl phosphite, tributyl phosphite, phenyl phosphite, diphenyl phosphite, and triphenyl phosphite. Of these, phosphoric acid, diphosphorus pentaoxide, or polyphosphoric acid is preferred in terms of doping properties.

Examples of boron compounds include boric acid, boron oxide, methyl borate, phenyl borate, trimethyl borate, triethyl borate, tripropyl borate, tributyl borate, trioctyl borate, and triphenyl borate.

The ratio of the mass of Si components in the impurity-diffusing composition in terms of $SiO_2$ to the atomic mass of impurities in the diffusion agent composition, $SiO_2$:impurity atoms, is preferably in the range of 99:1 to 30:70. The mass of Si components in terms of $SiO_2$ is the amount of Si components in the composition expressed in terms of the mass of $SiO_2$. To provide particularly excellent doping properties, the value of the atomic mass of impurities is preferably larger, and to provide particularly excellent crack resistance and masking properties and reduce the influence of a diffusion atmosphere, the value of the mass in terms of $SiO_2$ is preferably larger. Within the above range, particularly excellent doping properties, crack resistance, and masking properties are provided, and also the influence of a diffusion atmosphere can be reduced. The mass ratio is more preferably in the range of 95:5 to 40:60, most preferably in the range of 90:10 to 50:50. This mass ratio can be calculated by inorganic analysis such as inductively coupled plasma-atomic emission spectroscopy or X-ray fluorescence analysis.

The impurity-diffusing composition of the present invention preferably contains a solvent. Any solvent can be used without particular limitation, but to improve the printability in screen printing, spin coat printing, or other printing, solvents having a boiling point of 100° C. or higher are preferred. When the boiling point is 100° C. or higher, for example, the impurity-diffusing composition, when printed on a printing plate used in screen printing, can be prevented from drying and getting fixed on the printing plate.

The amount of the solvent having a boiling point of 100° C. or higher is preferably at least 20% by weight based on the total amount of solvents. Examples of the solvent having a boiling point of 100° C. or higher include diethylene glycol methyl ethyl ether (boiling point: 176° C.), ethylene glycol monoethyl ether acetate (boiling point: 156.4° C.), ethylene glycol monomethyl ether acetate (boiling point: 145° C.), methyl lactate (boiling point: 145° C.), ethyl lactate (boiling point: 155° C.), diacetone alcohol (boiling point: 169° C.), propylene glycol monomethyl ether acetate (boiling point: 145° C.), 3-methoxy-3-methyl-1-butanol (boiling point: 174° C.), dipropylene glycol monomethyl ether (boiling point: 188° C.), dipropylene glycol-n-butyl ether (boiling point: 229° C.), γ-butyrolactone (boiling point: 204° C.), diethylene glycol monoethyl ether acetate (boiling point: 217° C.), butyl diglycol acetate (boiling point: 246° C.), ethyl acetoacetate (boiling point: 181° C.), N-methyl-2-pyrrolidone (boiling point: 204° C.), N,N-dimethylimidazolidinone (boiling point: 226° C.), dipropylene glycol methyl ether acetate (boiling point: 213° C.), 1,3-butylene glycol diacetate (boiling point: 232° C.), diisobutyl ketone (boiling point: 168° C.), propylene glycol t-butyl ether (boiling point: 151° C.), propylene glycol n-butyl ether (boiling point: 170° C.), acetylacetone (boiling point: 140° C.), diethylene glycol monobutyl ether (boiling point: 171° C.), and diethylene glycol monobutyl ether acetate (boiling point: 245° C.).

Specific examples of solvents having a boiling point of lower than 100° C. include alcohols such as methanol, ethanol, propanol, isopropanol, and t-butanol; ethers such as diethyl ether and diisopropyl ether; ketones such as methyl ethyl ketone; acetates such as isopropyl acetate, ethyl acetate, propyl acetate, n-propyl acetate, and 3-methyl-3-methoxybutyl acetate; and aliphatic hydrocarbons such as hexane and cyclohexane.

The impurity-diffusing composition of the present invention may contain a surfactant. Containing a surfactant provides a uniform coating film with improved unevenness. Preferred surfactants are fluorochemical surfactants and silicone surfactants.

Specific examples of fluorochemical surfactants include fluorochemical surfactants including a compound having a fluoroalkyl group or a fluoroalkylene group at least one of terminals, the main chain, and the side chain, such as 1,1,2,2-tetrafluorooctyl(1,1,2,2-tetrafluoropropyl) ether, 1,1,2,2-tetrafluorooctylhexyl ether, octaethylene glycol di(1,1,2,2-tetrafluorobutyl) ether, hexaethylene glycol (1,1,2,2,3,3-hexafluoropentyl) ether, octapropylene glycol di(1,1,2,2-tetrafluorobutyl) ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-[3-(perfluorooctanesulfonamide)propyl]-N,N'-dimethyl-N-carboxymethylene ammonium betaine, perfluoroalkylsulfonamide propyltrimethylammonium salt, perfluoroalkyl-N-ethylsulfonylglycine salt, bis(N-perfluorooctylsulfonyl-N-ethylaminoethyl) phosphate, and monoperfluoroalkyl ethylphosphoric acid ester. Examples of commercially available products thereof include fluorochemical surfactants such as MEGAFACE F142D, MEGAFACE F172, MEGAFACE F173, MEGAFACE F183, MEGAFACE F444, MEGAFACE F475, MEGAFACE F477 (available from Dainippon Ink And Chemicals, Incorporated), EFTOP EF301, EFTOP EF303, EFTOP EF352 (available from Shin-Akita Kasei K.K.), Fluorad FC-430, Fluorad FC-431 (available from Sumitomo 3M Limited), AsahiGuard AG710, Surflon S-382, Surflon SC-101, Surflon SC-102, Surflon SC-103, Surflon SC-104, Surflon SC-105, Surflon SC-106 (available from Asahi Glass Co., Ltd.), BM-1000, BM-1100 (available from Yusho Co., Ltd.), and NBX-15, FTX-218, DFX-218 (available from NEOS COMPANY LIMITED).

Examples of commercially available products of silicone surfactants include SH28PA, SH7PA, SH21PA, SH30PA, ST94PA (all available from Dow Corning Toray Co., Ltd.), and BYK067A, BYK310, BYK322, BYK331, BYK333, BYK355 (available from BYK-Chemie Japan).

The amount of surfactant, if added, is preferably 0.0001 to 1% by weight of the impurity-diffusing composition.

The impurity-diffusing composition of the present invention preferably contains a thickener for viscosity control. The thickener enables an application in a finer pattern in printing such as screen printing. Examples of thickeners include organic thickeners such as cellulose, cellulose derivatives, starch, starch derivatives, polyvinylpyrrolidone, polyvinyl acetate, polyvinyl alcohol, polyvinyl butyral, polyurethane resins, polyurea resins, polyimide resins, polyamide resins, epoxy resins, polystyrene resins, polyester resins, synthetic rubber, natural rubber, polyacrylic acid, various acrylic resins, polyethylene glycol, polyethylene oxide, polypropylene glycol, polypropylene oxide, silicone oil, sodium alginate, xanthan gum polysaccharides, gellan gum polysaccharides, guar gum polysaccharides, carrageenan polysaccharides, locust bean gum polysaccharides, carboxy vinyl polymer, hydrogenated castor oil-based ones, mixtures of hydrogenated castor oil-based one and fatty acid amide wax-based one, special fatty acid-based ones, polyethylene oxide-based ones, mixtures of polyethylene oxide-based one and amide-based one, fatty acid-based polycarboxylic acids, phosphate surfactants, salts of long-chain polyaminoamide and phosphoric acid, and specially modified polyamide-based ones; and inorganic thickeners such as bentonite, montmorillonite, magnesian montmorillonite, iron montmorillonite, iron magnesian montmorillonite, beidellite, alumine beidellite, saponite, aluminian saponite, laponite, aluminum silicate, magnesium aluminum silicate, organic hectorite, silicon oxide fine particles, colloidal alumina, and calcium carbonate. These may be used in combination of two or more.

Examples of commercially available products include the following: cellulose thickeners such as 1110, 1120, 1130, 1140, 1150, 1160, 1170, 1180, 1190, 2200, 2260, 2280, 2450 (all available from Daicel Finechem Ltd.); polysaccharides thickeners such as Viscarin PC209, Viscarin PC389, SeaKem XP8012 (available from FMC Chemicals Inc.), and CAM-H, GJ-182, SV-300, LS-20, LS-30, XGT, XGK-D, G-100, LG-10 (all available from Mitsubishi Corporation.); acrylic thickeners such as #2434T, KC7000, KC1700P (available from Kyoeisha Chemical Co., Ltd.), and AC-10LHPK, AC-10SHP, 845H, PW-120 (available from Toagosei Co., Ltd.); hydrogenated castor oil-based thickeners such as DISPARLON 308, NAMLONT-206 (available from Kusumoto Chemicals, Ltd.), and T-20SF, T-75F (available from Itoh Oil Chemicals Co., Ltd.); polyethylene oxide thickeners such as D-10A, D-120, D-120-10, D-1100, DS-525, DS-313 (available from Itoh Oil Chemicals Co., Ltd.), DISPARLON 4200-20, DISPARLON PF-911, DISPARLON PF-930, DISPARLON 4401-25X, DISPARLON NS-30, DISPARLON NS-5010, DISPARLON NS-5025, DISPARLON NS-5810, DISPARLON NS-5210, DISPARLON NS-5310 (available from Kusumoto Chemicals, Ltd.), and FLOWNON SA-300, FLOWNON SA-300H (available from Kyoeisha Chemical Co., Ltd.); amide thickeners such as T-250F, T-550F, T-850F, T-1700, T-1800, T-2000 (available from Itoh Oil Chemicals Co., Ltd.), DISPARLON 6500, DISPARLON 6300, DISPARLON 6650, DISPARLON 6700, DISPARLON 3900EF (available from Kusumoto Chemicals, Ltd.), and TALEN 7200, TALEN 7500, TALEN 8200, TALEN 8300, TALEN 8700, TALEN 8900, TALEN KY-2000, KU-700, TALEN M-1020, TALEN VA-780, TALEN VA-750B, TALEN 2450, FLOWNON SD-700, FLOWNON SDR-80, FLOWNON EC-121 (available from Kyoeisha Chemical Co., Ltd.); bentonite thickeners such as BEN-GEL, BEN-GEL HV, BEN-GEL HVP, BEN-GEL F, BEN-GEL FW, BEN-GEL BRIGHT 11, BEN-GEL A, BEN-GEL W-100, BEN-GEL W-100U, BEN-GEL W-300U, BEN-GEL SH, MULTI-BEN, S-BEN, S-BEN C, S-BEN E, S-BEN W, S-BEN P, S-BEN WX, ORGANITE, ORGANITE D (available from HOJUN., Co., Ltd.); and silicon oxide fine particle thickeners such as AEROSIL R972, AEROSIL R974, AEROSIL NY50, AEROSIL RY200S, AEROSIL RY200, AEROSIL RX50, AEROSIL NAX50, AEROSIL RX200, AEROSIL RX300, AEROSIL VPNKC130, AEROSIL R805, AEROSIL R104, AEROSIL R711, AEROSIL OX50, AEROSIL 50, AEROSIL 90G, AEROSIL 130, AEROSIL 200, AEROSIL 300, AEROSIL 380 (available from Nippon Aerosil Co., Ltd.), and WACKER HDK S13, WACKER HDK V15, WACKER HDK N20, WACKER HDK N20P, WACKER HDK T30, WACKER HDK T40, WACKER HDK H15, WACKER HDK H18, WACKER HDK H20, WACKER HDK H30 (available from Asahi Kasei Corporation).

To form a dense film and reduce residues, the thickener preferably has a 90% pyrolysis temperature of not higher than 400° C. Specifically, polyethylene glycol, polyethylene oxide, polypropylene glycol, polypropylene oxide, and various acrylate resins are preferred, and of these, polyethylene oxide, polypropylene oxide, and acrylate resins are preferred. In terms of storage stability, acrylate resins are particularly preferred. "90% pyrolysis temperature" herein refers to a temperature at which the weight of the thickener decreases through pyrolysis by 90%. The pyrolysis temperature can be measured using, for example, thermogravimetric analysis (TGA).

Examples of acrylate resins include polyacrylates such as polymethyl methacrylate, polyethyl methacrylate, polypropyl methacrylate, polybutyl methacrylate, polymethyl acrylate, polyethyl acrylate, polypropyl acrylate, polybutyl acrylate, polyhydroxyethyl methacrylate, polybenzyl methacrylate, and polyglycidyl methacrylate, and copolymers thereof. In the case of a copolymer, it is only required that the acrylate components be polymerized in an amount of at least 60 mol %, and vinyl polymerizable components such as polyacrylic acid and polystyrene may be copolymerized as other copolymer components.

For polyethylene oxide and polypropylene oxide, the copolymer of these two oxides is also preferred. For all of the acrylate resins, polyethylene oxide, and polypropylene oxide, the weight average molecular weight is preferably 100,000 or more because a high thickening effect is produced.

The amount of the thickener is preferably 3% by weight to 20% by weight of the impurity-diffusing composition. The thickener in this range produces a sufficient viscosity control effect while enabling formation of a dense film.

From the viewpoint of screen printing property, it is preferable to use a thixotropic agent for providing thixotropy. To provide thixotropy is to increase the ratio ($\eta_1/\eta_2$) of the viscosity at low shear stress ($\eta_1$) to the viscosity at high shear stress ($\eta_2$). Containing a thixotropic agent improves pattern accuracy in screen printing. This is due to the following reasons. At high shear stress, the impurity-diffusing composition containing a thixotropic agent has a low viscosity and, therefore, is unlikely to cause a screen to clog during screen printing, whereas at low shear stress, the impurity-diffusing composition has a high viscosity and, therefore, is unlikely to cause bleeding immediately after printing and an increase in line width of a pattern.

Specific examples of thixotropic agents include cellulose, cellulose derivatives, sodium alginate, xanthan gum polysaccharides, gellan gum polysaccharides, guar gum polysaccharides, carrageenan polysaccharides, locust bean gum polysaccharides, carboxy vinyl polymer, hydrogenated castor oil-based ones, mixtures of hydrogenated castor oil-based one and fatty acid amide wax-based one, special fatty acid-based ones, polyethylene oxide-based ones, mixtures of polyethylene oxide-based one and amide-based one, fatty acid-based polycarboxylic acids, phosphate surfactants, salts of long-chain polyaminoamide and phosphoric acid, specially modified polyamide-based ones, bentonite, montmorillonite, magnesian montmorillonite, iron montmorillonite, iron magnesian montmorillonite, beidellite, alumine beidellite, saponite, aluminian saponite, laponite, aluminum silicate, magnesium aluminum silicate, organic hectorite, silicon oxide fine particles, colloidal alumina, and calcium carbonate. The thixotropic agents may be used alone, and two or more thixotropic agents may also be combined. Combined use with the above-described thickeners is more preferred and produces a higher effect. The viscosity of the impurity-diffusing composition of the present invention is not critical and can be appropriately varied according to the printing method and the film thickness. For example, in the case of screen printing, a preferred printing method, the viscosity of the diffusing composition is preferably 5,000 mPa·s or more. This is because bleeding of a printed pattern can be prevented to result in a good pattern. More preferably, the viscosity is 10,000 mPa·s or more. The upper limit is not critical, but it is preferably not more than 100,000 mPa·s from the viewpoint of storage stability and handleability. The viscosity, when being less than 1,000 mPa·s, is a value determined in accordance with JIS Z 8803 (1991) "Methods for viscosity measurement of solution" using an E-type digital viscometer at a rotation speed of 20 rpm, and the viscosity, when being 1,000 mPa·s or more, is a value determined in accordance with JIS Z 8803 (1991) "Methods for viscosity measurement of solution" using a B-type digital viscometer at a rotation speed of 20 rpm. The thixotropy can be determined from the ratio of viscosities at varying rotation speeds obtained by the viscosity measurement method above. In the present invention, the thixotropy is defined as the ratio ($\eta_2/\eta_{20}$) of the viscosity at a rotation speed of 20 rpm ($\eta_{20}$) to the viscosity at a rotation speed of 2 rpm ($\eta_2$). To form a highly accurate pattern in screen printing, the thixotropy is preferably at least 2, more preferably at least 3.

The solids concentration of the impurity-diffusing composition of the present invention is not critical and preferably in the range of 1% by weight to 90% by weight. A solids concentration lower than this range results in too thin coating, making it difficult to provide the desired doping properties and masking properties, and a solids concentration higher than this range results in reduced storage stability.

The method of forming an impurity diffusion layer using the impurity-diffusing composition of an embodiment of the present invention and a method of manufacturing a semiconductor device using the impurity diffusion layer will be described with reference to FIG. 1 and FIG. 2. FIG. 1 illustrates a method of forming an impurity diffusion layer including the steps of forming a pattern using a impurity-diffusing composition, diffusing n-type impurities from the pattern into the semiconductor substrate, and diffusing p-type impurities into the semiconductor substrate using the pattern as a mask. FIG. 2 illustrates a method of manufacturing a semiconductor device using the impurity diffusion layer in the case of manufacturing an interdigitated back-contact solar cell.

First, as shown in FIG. 1(a), an n-type impurity-diffusing composition 2 of an embodiment of the present invention is formed in a pattern on a semiconductor substrate 1.

Examples of the semiconductor substrate 1 include n-type single-crystal silicon substrates having an impurity concentration of $10^{15}$ to $10^{16}$ atoms/cm$^3$, polycrystalline silicon substrates, and crystalline silicon substrates with other elements such as germanium and carbon added. Semiconductors made of p-type crystalline silicon or materials other than silicon can also be used. The semiconductor substrate 1 preferably has a thickness of 50 to 300 μm and a shape of a roughly square of side 100 to 250 mm. To remove slice damage and naturally grown oxide, it is preferable to etch the surface using, for example, a hydrofluoric acid solution or an alkaline solution.

On a light receiving face of the semiconductor substrate 1, a barrier coating may be formed. As the barrier coating, a known barrier coating such as silicon oxide or silicon nitride, which is formed using a technique such as chemical vapor deposition (CVD) or spin on glass (SOG), can be used.

Examples of the method of forming a pattern of the n-type impurity-diffusing composition 2 include screen printing, ink jet printing, slit coating, spray coating, relief printing, and intaglio printing. After a pattern is formed by such a method, the n-type impurity-diffusing composition 2 is preferably dried, for example, on a hot plate or in an oven at a temperature range of 50 to 200° C. for 30 seconds to 30 minutes. The thickness of the dried n-type impurity-diffusing composition 2 is preferably at least 200 nm in view of masking properties for p-type impurities, and preferably 5 μm or less from the viewpoint of crack resistance.

Next, as shown in FIG. 1(b), impurities in the n-type impurity-diffusing composition 2 are diffused into the semiconductor substrate 1 to form an n-type impurity diffusion layer 3. The n-type impurities can be diffused by any known thermal diffusion method, and, for example, methods such as electrical heating, infrared heating, laser heating, and microwave heating can be used.

The time and temperature of thermal diffusion can be appropriately set so as to provide the desired diffusion properties such as impurity diffusion concentration and diffusion depth. For example, an n-type diffusion layer having a surface impurity concentration of $10^{19}$ to $10^{21}$ can be formed by thermal diffusion at 800° C. to 1200° C. for 1 to 120 minutes.

The diffusion atmosphere is not critical. The diffusion may be carried out in the air, or the oxygen content in the atmosphere may be appropriately controlled using an inert gas such as nitrogen or argon. From the viewpoint of shortening of diffusion time, the oxygen content in the atmosphere is preferably controlled to be 3% or less.

After the n-type impurities are diffused into the semiconductor substrate 1, the n-type impurity-diffusing composition 2 can be removed using a known etchant such as hydrofluoric acid. After doing so, printing of a p-type impurity-diffusing composition on the semiconductor substrate in which the n-type impurity diffusion layer is formed and diffusion of p-type impurities may be carried out, but as will be described below, printing of the p-type impurity-diffusing composition and diffusion of p-type impurities may also be carried out without removing the n-type impurity-diffusing composition 2, which is preferred from the viewpoint of reduction in the number of steps.

After the n-type impurities are diffused, the n-type impurity-diffusing composition 2 is fired as required, and then a p-type impurity-diffusing composition 4 is applied using the n-type impurity-diffusing composition 2 as a mask, as shown in FIG. 1(c). In this case, the p-type impurity-diffusing composition 4 may be formed over the whole surface as shown in FIG. 1(c), or it may be formed only on parts without the n-type impurity-diffusing composition 2. Alternatively, the p-type impurity-diffusing composition 4 may be applied such that it partially overlaps the n-type impurity-diffusing composition 2.

The p-type impurity-diffusing composition 4 can be applied using the above-described method exemplified as a method of forming a pattern of the n-type impurity-diffusing composition.

Next, as shown in FIG. 1(d), the p-type impurity-diffusing t composition 4 is diffused into the semiconductor substrate 1 using the fired n-type impurity-diffusing composition 2 as a mask layer, thereby forming a p-type impurity diffusion layer 5. The p-type impurities may be diffused by the same method as the method of diffusing n-type impurities.

Next, as shown in FIG. 1(e), the n-type impurity-diffusing composition 2 and the p-type impurity-diffusing composition 4 formed on the surface of the semiconductor substrate 1 are removed by a known etching process. The material used for etching may be any material, and, for example, a material is preferred which contains at least one of hydrogen fluoride, ammonium, phosphoric acid, sulfuric acid, and nitric acid as an etching component and other components such as water and organic solvent. Through the above process, n-type and p-type impurity diffusion layers can be formed on a semiconductor substrate. By employing such a process, simplified steps compared to those in conventional methods can be achieved.

In the above description, an example is given in which an n-type impurity-diffusing composition is applied and diffused, and then a p-type impurity-diffusing composition is applied and diffused, but it is also possible to apply and diffuse a p-type impurity-diffusing composition and then apply and diffuse an n-type impurity-diffusing composition.

The method of manufacturing a semiconductor device according to an embodiment of the present invention will now be described with reference to FIG. 2 taking an interdigitated back-contact solar cell as an example. First, as shown in FIG. 2(f), a barrier coating 6 is formed over the whole back surface of the semiconductor substrate 1 on which the n-type impurity diffusion layer 3 and the p-type impurity diffusion layer 5 are formed. Next, as shown in FIG. 2(g), the barrier coating 6 is patterned, for example, by etching to form a barrier coating opening 6a. Furthermore, as shown in FIG. 2(h), using a technique such as stripe coating or screen printing, electrode paste is applied in a pattern to regions each including the opening 6a and fired to form an n-type contact electrode 7 and a p-type contact electrode 8. As a result of this, an interdigitated back-contact solar cell 9 is obtained.

Another method of forming an impurity diffusion layer using the impurity-diffusing composition of an embodiment of the present invention will be described with reference to FIG. 3. FIG. 3 illustrates a method of forming an impurity diffusion layer including the steps of forming a pattern using an n-type impurity-diffusing composition, applying a p-type impurity-diffusing composition using the n-type impurity-diffusing composition as a mask, and diffusing n-type impurities and p-type impurities respectively from the n-type impurity-diffusing composition and the p-type impurity-diffusing composition into the semiconductor substrate.

First, as shown in FIG. 3(a), the n-type impurity-diffusing composition 2 of the present invention is formed in a pattern on the semiconductor substrate 1. Next, the n-type impurity-diffusing composition 2 is fired as required, and then the p-type impurity-diffusing composition 4 is applied using the n-type impurity-diffusing composition 2 as a mask as shown in FIG. 3(b). Thereafter, as shown in FIG. 3(c), an n-type impurity diffusion component in the n-type impurity-diffusing composition 2 and a p-type impurity diffusion component in the p-type impurity-diffusing composition 4 are simultaneously diffused into the semiconductor substrate 1 to form the n-type impurity diffusion layer 3 and the p-type impurity diffusion layer 5. The method of applying, firing, and diffusing the impurity-diffusing compositions may be the same as described above.

Next, as shown in FIG. 3(d), the n-type impurity-diffusing composition 2 and the p-type diffusion agent composition 4 formed on the surface of the semiconductor substrate 1 are removed by a known etching process. Through the above process, n-type and p-type impurity diffusion layers can be formed on a semiconductor substrate. By employing such a process, further simplified steps compared to those in conventional methods can be achieved.

The present invention is not limited to the embodiments described above. Various modifications such as design changes can be made based on the knowledge of those skilled in the art, and embodiments in which such a modification is made are also within the scope of the present invention.

The impurity-diffusing composition of the present invention can be used for photovoltaic devices, such as solar batteries, as well as semiconductor devices obtained by patterning an impurity diffusion region on a semiconductor surface, such as transistor arrays, diode arrays, photodiode arrays, and transducers.

EXAMPLES

The present invention will now be described in more detail with reference to examples, but these examples are not intended to limit the present invention. The abbreviations used to denote compounds used in examples are shown below.

GBL: γ-butyrolactone
BC: butyl carbitol
TERP: terpineol
PEO: polyethylene oxide
PMMA: polymethyl methacrylate
PPO: polypropylene oxide
PVP: polyvinylpyrrolidone
PVB: polyvinyl butyral
EtOH: ethanol
PhTMS: phenyltrimethoxysilane
PhTES: phenyltriethoxysilane
TolTMS: p-tolyltrimethoxysilane
MeOPhTMS: p-methoxyphenyltrimethoxysilane
MeTMS: methyltrimethoxysilane
EtTMS: ethyltrimethoxysilane
PrTMS: propyltrimethoxysilane
BuTMS: butyltrimethoxysilane
HexTMS: hexyltrimethoxysilane
MePhDMS: methylphenyldimethoxysilane
PhEtTMS: 2-phenylethyltrimethoxysilane
TEOS: tetraethoxysilane (1) Measuring Solution Viscosity and Thixotropy For impurity-diffusing compositions having a viscosity of less than 1,000 mPa·s, the viscosity at a solution temperature of 25° C. and a rotation speed of 20 rpm was measured using a rotational viscometer TVE-25L (E-type digital viscometer) manufactured by Toki Sangyo Co., Ltd. For impurity-diffusing compositions having a viscosity of 1,000 mPa·s or more, the viscosities at a solution temperature of 25° C. and various rotation speeds were measured using RVDV-11+P (B-type digital viscometer) manufactured by Brookfield. The measured value at a rotation speed of 20 rpm was used as the viscosity, and the ratio ($\eta_2/\eta_{20}$) of the measured value at a rotation speed of 20 rpm ($\eta_{20}$) to the measured value at a rotation speed of 2 rpm ($\eta_2$) was used as the thixotropy.

(2) Pattern Accuracy
(2-1) Slit Coating Property

A impurity-diffusing composition was formed into a stripe pattern using a slit nozzle, and the width accuracy of the stripe was observed.

For a substrate, a semiconductor substrate of side 156 mm composed of n-type single-crystal silicon was provided and alkaline etched on both surfaces to remove slice damage and naturally grown oxide. As a result of this, a myriad of typical irregularities about 40 to 100 μm in width and 3 to 4 μm in depth were formed on both surfaces of the semiconductor substrate, which was used as a substrate to be coated.

FIG. 4 illustrates a schematic view of the stripe coating apparatus used in Examples. With respect to a semiconductor substrate 31 vacuum-suctioned onto a stage 32, the position was adjusted using a CCD camera 36, and the height was adjusted using a height sensor 37. A nozzle 38 attached to a bracket 35 was moved in the Y direction by a linear drive (Y direction) 34, whereby the impurity-diffusing composition was applied to form a line. Similarly, the nozzle 38 was moved in the X direction by a predetermined distance by a linear drive (X direction) 33 to form a line. This procedure was repeated to form a stripe pattern.

The method of stripe coating is as described below. As illustrated in FIG. 5, the impurity-diffusing composition was supplied through a paste supply port 47. Pressure was applied through a pressure port 46 to discharge a paste 43 of the impurity-diffusing composition via a manifold 45 through a plurality of discharge ports 42 formed at the bottom of a nozzle 41. The nozzle 41 was moved perpendicular to the drawing plane with beads 44 formed between a semiconductor substrate 40 and the discharge ports 42.

After the stripe coating of the impurity-diffusing composition, the substrate was heated in air at 140° C. for 5 minutes, further at 230° C. for 30 minutes, to form a 600-μm pitch pattern about 1.0 μm in thickness, 240 μm in width, and 8 cm in length.

For randomly-selected one line, the line width was measured at 10 points at regular intervals. A coating width standard deviation σ of 15 μm or less was evaluated to be good, and that of more than 15 μm to be bad.

(2-2) Screen Printing Property

A impurity-diffusing composition was formed into a stripe pattern using screen printing, and the width accuracy of the stripe was observed.

For a substrate, a semiconductor substrate of side 156 mm composed of n-type single-crystal silicon was provided and alkaline etched on both surfaces to remove slice damage and naturally grown oxide. As a result of this, a myriad of typical irregularities about 40 to 100 μm in width and 3 to 4 μm in depth were formed on both surfaces of the semiconductor substrate, which was used as a substrate to be coated.

Using a screen printer (model TM-750 manufactured by Micro-tec Co., Ltd.), a screen mask in which 175 openings 200 μm in width and 13.5 cm in length were formed at a pitch of 600 μM (available from SUS, 400 meshes, wire diameter: 23 μm) was used to form a stripe pattern.

After the screen printing of the impurity-diffusing composition, the substrate was heated in air at 140° C. for 5 minutes, further at 230° C. for 30 minutes, to form a 600-μm pitch pattern about 1.5 μm in thickness, about 210 μm in width, and 13.5 cm in length.

For randomly-selected one line, the line width was measured at 10 points at regular intervals. A coating width standard deviation σ of 12.5 μm or less was evaluated to be superior (A), that of more than 12.5 μm but not more than 15 μm to be excellent (B), that of more than 15 μm but not more than 17.5 μm to be good (C), that of more than 17.5 μm but not more than 20 μm to be fair (D), and that of more than 20 μm to be bad (E).

(3) Measuring Crack Resistance

An n-type silicon wafer (available from Ferrotec Silicon Corporation, surface resistivity: 410Ω/□) cut to 3 cm×3 cm was immersed in a 1% aqueous hydrofluoric acid solution for one minute, washed with water, blown with air, and then treated on a hot plate at 140° C. for 5 minutes.

A impurity-diffusing composition was applied to the silicon wafer by known spin coating. The rotation speed was varied to prepare samples having varied thicknesses such that post-firing thicknesses would be different from one another by 0.1 μm. In the region of thin films, the impurity-diffusing composition and the impurity-diffusing composition diluted with the same solvent composition were appropriately used. After the application, the silicon wafers were pre-baked at 140° C. for 5 minutes.

The silicon wafers were then placed in an electric furnace and held at 900° C. for 30 minutes in an atmosphere of nitrogen and oxygen of 97:3 (volume ratio) to fire the impurity-diffusing composition film. Thereafter, the post-firing thickness was measured. The surface was observed under a light microscope fitted with a 5× lens, and the post-firing thickness of a thickest mask layer sample with no cracks observed was defined as a crack-resistant thickness.

(4) Measuring Masking Properties

The method of measuring masking properties will be described taking masking properties of an n-type impurity-diffusing composition for a p-type impurity-diffusing composition as an example. Onto the above observed substrate (3 cm×3 cm) with a crack-resistant thickness including an n-type impurity-diffusing composition, a p-type impurity-diffusing composition PBF (available from TOKYO OHKA KOGYO CO., LTD.) was applied at about half (1.5 cm×3 cm) the area, and pre-baked on a hot plate at 200° C. for 10 minutes. Thereafter, a silicon wafer was placed in an electric furnace and held at 900° C. for 60 minutes in a nitrogen atmosphere to thermally diffuse impurities. After the thermal diffusion, the silicon wafer was immersed in a 10% by weight aqueous hydrofluoric acid solution at 23° C. for one minute to remove the cured diffusion agent. For the silicon wafer after the removal, the surface resistance was measured using a four point probe measurement apparatus RT-70V (manufactured by NAPSON CORPORATION). When the difference between the surface resistance of the area where the n-type impurity-diffusing composition alone was applied and surface resistance of the area where the p-type impurity-diffusing composition was applied onto the n-type impurity-diffusing composition is within ±20%, it was judged as having masking properties. The post-firing thickness of a thinnest mask layer sample having masking properties was defined as a mask thickness.

The difference between the crack-resistant thickness and the mask thickness indicates a margin where the impurity-diffusing composition can be used as a masking material, and larger margins mean that the impurity-diffusing composition can be used in a wider range and is more excellent. In particular, for irregular substrates used in the field of solar cells, materials having a large thickness margin are preferred.

(5) Evaluating Removability

Silicon wafers after thermal diffusion were each immersed in a 10% by weight aqueous hydrofluoric acid solution at 23° C. for one minute to remove the diffusion agent and mask. After the removal, the silicon wafer was washed by immersion in pure water, and its surface was visually observed for the presence of residues. The removability was evaluated as follows: surface residues were visually detectable after 1-minute immersion and could not be removed by scraping with textile waste: worse; surface residues were visually detectable after 1-minute immersion but was able to be removed by scraping with textile waste: bad; surface residues became visually undetectable in over 30 seconds to 1 minute: good; and surface residues became visually undetectable in 30 seconds: excellent.

(6) Measuring Sheet Resistance

An n-type silicon wafer (available from Ferrotec Silicon Corporation, surface resistivity: 410Ω/□) cut to 3 cm×3 cm was immersed in a 1% aqueous hydrofluoric acid solution for one minute, washed with water, blown with air, and then treated on a hot plate at 140° C. for 5 minutes.

A impurity-diffusing composition to be measured was applied to the silicon wafer by known spin coating such that the thickness after pre-baking would be about 500 nm. After the application, the silicon wafer was pre-baked at 140° C. for 5 minutes.

The silicon wafer was then placed in an electric furnace and held at 900° C. for 30 minutes in an atmosphere of nitrogen and oxygen of 97:3 (volume ratio) to thermally diffuse impurities. After the thermal diffusion, the silicon wafer was immersed in a 10% by weight aqueous hydrofluoric acid solution at 23° C. for one minute to remove the cured diffusion agent. For the silicon wafer after the removal, the type, whether p or n, was determined using a p/n checker, and the surface resistance was measured using a four point probe measurement apparatus RT-70V (manufactured by NAPSON CORPORATION) and used as the sheet resistance. The sheet resistance is an indicator of impurity diffusibility, and smaller resistance values indicate larger amounts of impurity diffusion.

(7) Storage Stability

A impurity-diffusing composition was stored in a refrigerator (4° C.) for four weeks, and the storage stability was evaluated as follows: the viscosity change from the initial viscosity to the viscosity after four weeks was less than 3%: excellent; the viscosity change was 3% or more but less than 6%: good; the viscosity change was 6% or more but less than 10%: bad; and the viscosity change was 10% or more, or a phenomenon such as precipitation, becoming cloudy, or gelation occurred: worse.

Example 1

Synthesizing Polysiloxane Solution

Into a 500-mL three-necked flask, 164.93 g (1.21 mol) of KBM-13 (methyltrimethoxysilane), 204.07 g (1.21 mol) of KBM-103 (phenyltrimethoxysilane), and 363.03 g of GBL were loaded, and an aqueous phosphoric acid solution obtained by dissolving 1.215 g of phosphoric acid in 130.76 g of water was added with stirring at 40° C. over 30 minutes. After completion of the addition, the resulting solution was stirred at 40° C. for one hour, and then heated to 70° C. and stirred for 30 minutes. Thereafter, an oil bath was heated to 115° C. After one hour from the start of heating, the inner temperature of the solution reached 100° C., and then the solution was heated under stirring for one hour (the inner temperature was from 100 to 110° C.). The resulting solution was cooled in an ice bath to obtain a polysiloxane solution. The solids concentration of the polysiloxane solution was 39.8% by weight.

The polysiloxane synthesized above in an amount of 4.39 g, 1.47 g of phosphoric acid ($SiO_2$:P, the ratio of the mass in terms of $SiO_2$ to the atomic mass of phosphorus, =58:42), 12.55 g of GBL, and BYK-333 in such an amount that was 300 ppm relative to the whole solution were added and thoroughly stirred to ensure homogeneity. The viscosity and the thixotropy of the resulting solution were as shown in Table 3. Using the resulting solution, crack resistance, masking properties, removability, pattern accuracy, storage stability, and sheet resistance were measured to be all good as shown in Table 3.

Examples 2 to 8

Components were mixed at the compositions shown in Table 1 to prepare a impurity-diffusing composition. Crack resistance, masking properties, removability, pattern accuracy, storage stability, and sheet resistance were measured to be all good as shown in Table 3. In particular, impurity-diffusing compositions in which the proportion of aryl groups having 6 to 15 carbon atoms in polysiloxane was increased were less prone to cracks even when formed into a thicker film and had good crack resistance.

Examples 9 to 41

In Examples 9 to 41, various thickeners were added so as to give a predetermined concentration (% by weight) in the whole solution and dissolved using a planetary centrifugal mixer ARE-310 (manufactured by THINKY) (stirring: 15 min, deaeration: 1 min). Crack resistance, impurity diffusibility, masking properties, removability, pattern accuracy, storage stability, and sheet resistance were measured to be all good as shown in Table 3 and Table 4. Impurity-diffusing compositions in which all the constitutional units in polysiloxane were trifunctional organosilane were excellent in impurity diffusibility and removability. Impurity-diffusing compositions in which the proportion of aryl groups in polysiloxane was 40 mol % or more were excellent in impurity diffusibility and masking properties, and those in which the proportion of aryl groups in polysiloxane was 80 mol % or less were particularly good in removability.

Example 42

Method of Forming n-Type Impurity Diffusion Layer and p-Type Impurity Diffusion Layer As shown in FIG. 6(a), an n-type impurity-diffusing composition 52 described in Example 1 was partially applied to a p-type silicon wafer 51 (available from Ferrotec Silicon Corporation, surface resistivity: 410Ω/□) by screen printing. After the application, the p-type silicon wafer 51 was pre-baked at 140° C. for 5 minutes.

The p-type silicon wafer 51 was then placed in an electric furnace and held at 900° C. for 30 minutes in an atmosphere of nitrogen and oxygen of 97:3 to diffuse impurities in the n-type impurity-diffusing composition 52 into the p-type silicon wafer 51, thereby forming an n-type impurity diffusion layer 53 as shown in FIG. 6(b).

Thereafter, as shown in FIG. 6(c), a p-type impurity-diffusing-composition 54 (PBF, available from TOKYO OHKA KOGYO CO., LTD.) was applied over the whole surface of the p-type silicon wafer 51 by spin coating and pre-baked on a hot plate at 200° C. for 10 minutes. The p-type silicon wafer 51 was then placed in an electric furnace and held at 900° C. for 60 minutes in a nitrogen atmosphere to thermally diffuse impurities, thereby forming a p-type impurity diffusion layer 55 as shown in FIG. 6(d).

After the thermal diffusion, the p-type silicon wafer 51 was immersed in a 10% by weight aqueous hydrofluoric acid solution at 23° C. for one minute to remove the n-type impurity-diffusing composition 52 and the p-type impurity-diffusing composition 54. For the p-type silicon wafer 51 after the removal, the surface resistance was measured using a four point probe measurement apparatus RT-70V (manufactured by NAPSON CORPORATION). The sheet resistance was 20Ω/□ at the part where the n-type impurity-diffusing composition 52 was applied (determined to be n-type) and 65Ω/□ at the part where only the p-type impurity-diffusing composition 54 was applied (determined to be p-type), confirming that n-type and p-type impurity diffusion layers were formed.

Example 43

Method of Forming n-Type Impurity Diffusion Layer and p-Type Impurity Diffusion Layer As shown in FIG. 7(a), an n-type impurity-diffusing composition 62 described in Example 1 was partially applied to a p-type silicon wafer 61 (available from Ferrotec Silicon Corporation, surface resistivity: 410Ω/□) by screen printing. After the application, the P-type silicon wafer 61 was pre-baked at 100° C. for 5 minutes.

The p-type silicon wafer 61 was then placed in an electric furnace and held at 800° C. for 30 minutes in an air atmosphere to fire the n-type impurity-diffusing composition 62.

Thereafter, as shown in FIG. 7(b), a p-type impurity-diffusing composition 64 (PBF, available from TOKYO OHKA KOGYO CO., LTD.) was applied over the whole surface of the p-type silicon wafer 61 by spin coating and pre-baked on a hot plate at 200° C. for 10 minutes. The p-type silicon wafer 61 was then placed in an electric furnace and held at 900° C. for 60 minutes in a nitrogen atmosphere to thermally diffuse an impurity diffusion component, thereby forming an n-type impurity diffusion layer 63 and a p-type impurity diffusion layer 65 as shown in FIG. 7(c).

After the thermal diffusion, the p-type silicon wafer 61 was immersed in a 10% by weight aqueous hydrofluoric acid solution at 23° C. for one minute to remove the n-type diffusion agent composition 62 and the p-type impurity-diffusing composition 64. For the p-type silicon wafer 61 after the removal, the surface resistance was measured using a four point probe measurement apparatus RT-70V (manufactured by NAPSON CORPORATION). The sheet resistance was 15Ω/□ at the part where the n-type impurity-diffusing composition was applied (determined to be n-type) and 60Ω/□ at the part where only the p-type impurity-diffusing composition 64 was applied (determined to be p-type), confirming that n-type and p-type impurity diffusion layers were formed.

Comparative Example 1

Components were mixed at the composition shown in Table 1 and Table 2 to prepare a impurity-diffusing composition. Ethyl silicate 48 is a hydrolysis condensate (decamer on average) of tetraethoxysilane available from COLCOAT Co., Ltd. As shown in Table 3 and Table 4, the fired film of the impurity-diffusing-composition had an extremely small crack-resistant thickness and an extremely small mask margin.

Comparative Example 2

Components were mixed at the composition shown in Table 2 to prepare a impurity-diffusing composition. As shown in Table 4, the fired film of the impurity-diffusing composition had an extremely small crack-resistant thickness and an extremely small mask margin. The impurity-diffusing composition had poor storage stability such that it gelled after storage in a refrigerator (4° C.) for four weeks.

Comparative Example 3

Components were mixed at the composition shown in Table 2 to prepare a impurity-diffusing composition. As shown in Table 4, the fired film of the impurity-diffusing composition had a small crack-resistant thickness and a large mask thickness for a p-type impurity diffusion agent, and, therefore, a sufficient mask margin was not obtained. In addition, the fired film had a high sheet resistance and poor storage stability.

Comparative Example 4

Components were mixed at the composition shown in Table 2 to prepare a impurity-diffusing composition. As shown in Table 4, the fired film of the impurity-diffusing composition had a small crack-resistant thickness and a large mask thickness for a p-type impurity diffusion agent, and, therefore, a sufficient mask margin was not obtained. In addition, the fired film had a relatively high sheet resistance and poor storage stability.

Comparative Example 5

Components were mixed at the composition shown in Table 2 to prepare a impurity-diffusing composition. As shown in Table 4, the fired film of the impurity-diffusing composition had poor removability such that residues remained and, therefore, had a high sheet resistance.

Comparative Example 6

Components were mixed at the composition shown in Table 2 to prepare a impurity-diffusing composition. As shown in Table 4, the fired film of the impurity-diffusing composition had a small crack-resistant thickness and a relatively large mask thickness for a p-type impurity diffusion agent, and, therefore, a sufficient mask margin was not obtained. In addition, the fired film had poor removability such that residues remained and, therefore, had a high sheet resistance.

Examples and Comparative Examples are summarized in Tables 1 to 4. In Table 1 and Table 2, an expression such as "PhTMS (50)/MeTMS (50)", for example, means a product of condensation reaction of these compounds at the molar ratio given in the parenthesis.

TABLE 1

| | Polysiloxane(A) | | Impurity component (B) | | $SiO_2$: Impurity atoms | | Thickner (C) | | Solids concentration |
|---|---|---|---|---|---|---|---|---|---|
| | Composition | n/m | Component | $SiO_2$ | Impurity atoms | Component | Amount (wt %) | Sovent | (%) |
| Example 1 | PhTMS(60)/MeTMS(40) | 60/40 | Phosphoric acid | 58 | 42 | — | 0 | GBL | 15 |
| Example 2 | PhTMS(60)/MeTMS(40) | 60/40 | Phosphorus pentoxide | 58 | 42 | — | 0 | GBL/EtOH = 1/1 | 15 |
| Example 3 | PhTMS(50)/MeTMS(50) | 50/50 | Polyphosphoric acid | 58 | 42 | — | 0 | GBL | 15 |
| Example 4 | PhTMS(50)/MeTMS(50) | 50/50 | $B_2O_3$ | 58 | 42 | — | 0 | GBL | 15 |

TABLE 1-continued

| | Polysiloxane(A) Composition | n/m | Impurity component (B) Component | SiO$_2$: Impurity atoms SiO$_2$ | Impurity atoms | Thickner (C) Component | Amount (wt %) | Sovent | Solids concentration (%) |
|---|---|---|---|---|---|---|---|---|---|
| Example 5 | PhTMS(50)/MeTES(50) | 50/50 | Phosphoric acid | 58 | 42 | — | 0 | GBL | 15 |
| Example 6 | PhTMS(35)/MeTMS(65) | 35/65 | Phosphoric acid | 58 | 42 | — | 0 | GBL | 15 |
| Example 7 | PhTMS(25)/MeTMS(75) | 25/75 | Phosphoric acid | 58 | 42 | — | 0 | GBL | 15 |
| Example 8 | PhTMS(90)/MeTMS(10) | 90/10 | Phosphoric acid | 58 | 42 | — | 0 | GBL | 15 |
| Example 9 | PhTMS(50)/MeTMS(50) | 50/50 | Phosphoric acid | 58 | 42 | PEO-3 | 5 | GBL/BC = 1/1 | 20 |
| Example 10 | PhTMS(60)/MeTMS(40) | 60/40 | Polyphosphoric acid | 58 | 42 | PEO-3 | 5 | GBL/BC = 1/1 | 20 |
| Example 11 | PhTMS(40)/MeTMS(60) | 40/60 | Phosphoric acid | 58 | 42 | PEO-3 | 5 | GBL/BC = 1/1 | 25 |
| Example 12 | PhTMS(55)/MeTMS(45) | 55/45 | Phosphoric acid | 58 | 42 | PMMA | 5 | GBL | 20 |
| Example 13 | PhTMS(45)/MeTMS(55) | 45/55 | Phosphoric acid | 58 | 42 | PMMA | 10 | GBL | 25 |
| Example 14 | PhTMS(60)/MeTMS(40) | 60/40 | Phosphoric acid | 58 | 42 | PPO | 20 | GBL | 35 |
| Example 15 | PhTMS(25)/MeTMS(75) | 25/75 | Phosphoric acid | 58 | 42 | PMMA | 5 | GBL | 20 |
| Example 16 | TolTMS(60)/MeTMS(40) | 60/40 | Phosphoric acid | 58 | 42 | PEO-3 | 5 | GBL | 20 |
| Example 17 | MeOPhTMS(60)/MeTMS(40) | 60/40 | Phosphoric acid | 58 | 42 | PEO-3 | 5 | GBL | 20 |
| Example 18 | PhTMS(60)/EtTMS(40) | 60/40 | Phosphoric acid | 58 | 42 | PEO-3 | 5 | GBL | 20 |
| Example 19 | PhTMS(60)/BuTMS(40) | 60/40 | Phosphoric acid | 58 | 42 | PEO-3 | 5 | GBL | 20 |
| Example 20 | PhTMS(60)/HexTMS(40) | 60/40 | Phosphoric acid | 58 | 42 | PEO-3 | 5 | GBL | 20 |
| Example 21 | PhTMS(30)/BuTMS(70) | 30/70 | Phosphoric acid | 58 | 42 | PEO-3 | 5 | GBL | 20 |
| Example 22 | PhTMS(50)/EtTMS(50) | 50/50 | Phosphoric acid | 58 | 42 | KC7000 | 5 | GBL | 18 |
| Example 23 | PhTMS(30)/HexTMS(70) | 30/70 | Phosphoric acid | 58 | 42 | PEO-3 | 5 | GBL | 20 |
| Example 24 | MePhDMS(50)/MeTMS(50) | 50/50 | Phosphoric acid | 58 | 42 | PEO-3 | 5 | GBL/BC = 1/1 | 20 |

TABLE 2

| | Polysiloxane(A) Composition | n/m | Impurity component (B) Component | SiO$_2$: Impurity atoms SiO$_2$ | Impurity atoms | Thickner (C) Component | Amount (wt %) | Sovent | Solids concentration (%) |
|---|---|---|---|---|---|---|---|---|---|
| Example 25 | PhTMS(90)/TEOS(10) | 90/10 | Phosphoric acid | 58 | 42 | PMMA | 5 | GBL | 20 |
| Example 26 | PhTMS(50)/MeTMS(45)/TEOS(5) | 50/50 | Phosphoric acid | 58 | 42 | PEO-3 | 5 | GBL | 20 |
| Example 27 | PhTMS(50)/MeTMS(40)/TEOS(10) | 50/50 | Phosphoric acid | 58 | 42 | PEO-3 | 5 | GBL | 20 |
| Example 28 | PhTMS(60)/MeTMS(40) | 60/40 | Phosphoric acid | 58 | 42 | PEO-1 Flownon EC121 | 5 1.2 | GBL | 22 |
| Example 29 | PhTMS(60)/EtTMS(40) | 60/40 | Phosphoric acid | 58 | 42 | PEO-1 Disparlon 6700 | 5 2.0 | GBL | 22 |
| Example 30 | PhTMS(50)/MeTMS(50) | 50/50 | Phosphoric acid | 58 | 42 | KC7000 Flownon EC121 | 5 1.2 | GBL/TERP = 1/1 | 22 |
| Example 31 | PhTMS(40)/PrTMS(60) | 40/60 | Phosphoric acid | 58 | 42 | PMMA Flownon EC121 | 5 1.2 | GBL | 22 |
| Example 32 | PhTMS(60)/MeTMS(40) | 60/40 | Phosphoric acid | 58 | 42 | KC7000 Disparlon 6700 | 5 1.4 | GBL | 22 |
| Example 33 | PhTMS(40)/MeTMS(60) | 40/60 | Phosphoric acid | 58 | 42 | PEO-1 Disparlon 308 | 5 1.4 | GBL | 22 |
| Example 34 | PhTMS(50)/MeTMS(50) | 50/50 | Phosphoric acid | 58 | 42 | KC7000 Aerosil VPNKC130 | 5 2.0 | GBL/TERP = 1/1 | 30 |
| Example 35 | PhTMS(50)/MeTMS(50) | 50/50 | Phosphoric acid | 58 | 42 | PEO-1 Aerosil RY200S | 5 2.0 | GBL | 22 |
| Example 36 | PhTMS(60)/EtTMS(40) | 60/40 | Phosphoric acid | 58 | 42 | PMMA Aerosil R805 | 5 2.0 | GBL | 22 |
| Example 37 | PhTMS(50)/MeTMS(50) | 50/50 | Phosphoric acid | 58 | 42 | PEO-1 NAMLON T-206 | 5 2.0 | GBL | 22 |
| Example 38 | PhTMS(50)/BuTMS(50) | 50/50 | Phosphoric acid | 58 | 42 | KC7000 Talen BA600 | 5 1.5 | GBL | 22 |

TABLE 2-continued

|  | Polysiloxane(A) | | Impurity component (B) | SiO$_2$: Impurity atoms | | Thickner (C) | | | Solids concentration |
|---|---|---|---|---|---|---|---|---|---|
|  | Composition | n/m | Component | SiO$_2$ | Impurity atoms | Component | Amount (wt %) | Sovent | (%) |
| Example 39 | PhTMS(50)/MeTMS(50) | 50/50 | Phosphoric acid | 58 | 42 | KC7000 Aerosil RY200S Flownon EC1 21 | 5 1 0.8 | GBL | 22 |
| Example 40 | PhTMS(25)/MeTMS(75) | 25/75 | Phosphoric acid | 58 | 42 | PEO-1 NAMLON T-206 | 5 2.0 | GBL | 20 |
| Example 41 | PhTMS(90)/MeTMS(10) | 90/10 | Phosphoric acid | 58 | 42 | KC7000 Disparlon 6700 | 5 1.4 | GBL | 20 |
| Comparative Example 1 | Ethyl silicate 48 | 0/100 | Phosphorus pentoxide | 58 | 42 | — | 0 | GBL/EtOH = 1:1 | 15 |
| Comparative Example 2 | Ethyl silicate 48 | 0/100 | Phosphoric acid | 58 | 42 | PEO-3 | 5 | GBL | 20 |
| Comparative Example 3 | MeTMS(50)/PrTMS(50) | 0/100 | Phosphoric acid | 58 | 42 | PEO-3 | 5 | GBL | 20 |
| Comparative Example 4 | PhTMS(20)/MeTMS(80) | 20/80 | Phosphoric acid | 58 | 42 | PEO-3 | 5 | GBL | 20 |
| Comparative Example 5 | PhTMS(100) | 100/0 | Phosphoric acid | 58 | 42 | PEO-3 | 5 | GBL | 20 |
| Comparative Example 6 | PhTMS(30)/PhEtTMS(70) | 30/70 | Phosphoric acid | 58 | 42 | PEO-3 | 5 | GBL | 20 |

TABLE 3

|  | Viscosity (mPas) | Thixotropy | Crack-resistant thickness post-firing (μm) | Mask thickness (μm) | Mask margin (μm) | Removability | Pattern accuracy Slit coating property | Pattern accuracy Screen printing | Sheet resistance (Ω/□) | Storage stability |
|---|---|---|---|---|---|---|---|---|---|---|
| Example 1 | 21.7 | 1.1 | 1.84 | 0.15 | 1.69 | excellent | good | — | 35 | excellent |
| Example 2 | 18.9 | 1.1 | 1.84 | 0.16 | 1.68 | excellent | good | — | 37 | excellent |
| Example 3 | 22.4 | 1.1 | 1.71 | 0.16 | 1.55 | excellent | good | — | 35 | excellent |
| Example 4 | 23.8 | 1.1 | 1.72 | 0.16 | 1.56 | excellent | good | — | 50 | excellent |
| Example 5 | 24.5 | 1.1 | 1.72 | 0.15 | 1.57 | excellent | good | — | 37 | excellent |
| Example 6 | 29.4 | 1.1 | 0.99 | 0.22 | 0.77 | excellent | good | — | 51 | good |
| Example 7 | 20.3 | 1.1 | 0.83 | 0.21 | 0.62 | excellent | good | — | 64 | good |
| Example 8 | 20.5 | 1.1 | 1.89 | 0.16 | 1.73 | good | good | — | 61 | excellent |
| Example 9 | 17750 | 1.7 | 1.73 | 0.15 | 1.58 | excellent | — | B | 45 | excellent |
| Example 10 | 17250 | 1.7 | 1.85 | 0.16 | 1.69 | excellent | — | B | 46 | excellent |
| Example 11 | 17350 | 1.7 | 1.65 | 0.15 | 1.50 | excellent | — | B | 29 | excellent |
| Example 12 | 11250 | 1.2 | 1.80 | 0.15 | 1.65 | excellent | — | C | 45 | excellent |
| Example 13 | 11200 | 1.4 | 1.68 | 0.16 | 1.52 | excellent | — | C | 46 | excellent |
| Example 14 | 10750 | 1.6 | 1.85 | 0.14 | 1.71 | excellent | — | D | 47 | excellent |
| Example 15 | 12300 | 1.4 | 0.83 | 0.21 | 0.62 | excellent | — | C | 65 | good |
| Example 16 | 17100 | 1.7 | 1.85 | 0.17 | 1.68 | excellent | — | B | 45 | excellent |
| Example 17 | 17350 | 1.7 | 1.84 | 0.21 | 1.63 | excellent | — | B | 43 | excellent |
| Example 18 | 17250 | 1.7 | 1.80 | 0.16 | 1.64 | excellent | — | B | 44 | excellent |
| Example 19 | 16900 | 1.7 | 1.84 | 0.16 | 1.68 | excellent | — | B | 43 | excellent |
| Example 20 | 17100 | 1.7 | 1.86 | 0.16 | 1.70 | good | — | B | 66 | excellent |
| Example 21 | 17500 | 1.7 | 0.98 | 0.19 | 0.79 | excellent | — | B | 52 | good |
| Example 22 | 6000 | 1.2 | 1.73 | 0.19 | 1.54 | excellent | — | C | 40 | excellent |
| Example 23 | 17250 | 1.7 | 0.98 | 0.19 | 0.79 | good | — | B | 69 | good |
| Example 24 | 17000 | 1.7 | 1.72 | 0.15 | 1.57 | good | — | B | 72 | excellent |

TABLE 4

|  | Viscosity (mPas) | Thixotropy | Crack-resistant thickness post-firing (μm) | Mask thickness (μm) | Mask margin (μm) | Removability | Pattern accuracy Slit coating property | Pattern accuracy Screen printing property | Sheet resistance (Ω/□) | Storage stability |
|---|---|---|---|---|---|---|---|---|---|---|
| Example 25 | 12300 | 1.4 | 1.87 | 0.18 | 1.69 | good | — | C | 70 | excellent |
| Example 26 | 17200 | 1.8 | 1.81 | 0.18 | 1.63 | good | — | B | 66 | excellent |

TABLE 4-continued

| | Viscosity (mPas) | Thixotropy | Crack-resistant thickness post-firing (μm) | Mask thickness (μm) | Mask margin (μm) | Removability | Pattern accuracy Slit coating property | Pattern accuracy Screen printing property | Sheet resistance (Ω/□) | Storage stability |
|---|---|---|---|---|---|---|---|---|---|---|
| Example 27 | 17000 | 1.8 | 1.79 | 0.18 | 1.61 | good | — | B | 67 | excellent |
| Example 28 | 6000 | 4.1 | 1.84 | 0.15 | 1.69 | excellent | — | A | 42 | excellent |
| Example 29 | 5700 | 4.1 | 1.84 | 0.15 | 1.69 | excellent | — | A | 41 | excellent |
| Example 30 | 6000 | 5.0 | 1.76 | 0.16 | 1.60 | excellent | — | A | 40 | excellent |
| Example 31 | 11000 | 4.9 | 1.69 | 0.16 | 1.53 | excellent | — | A | 41 | excellent |
| Example 32 | 5500 | 4.9 | 1.81 | 0.15 | 1.66 | excellent | — | A | 41 | excellent |
| Example 33 | 6800 | 4.7 | 1.69 | 0.15 | 1.54 | excellent | — | A | 40 | excellent |
| Example 34 | 6000 | 3.6 | 2.11 | 0.15 | 1.96 | excellent | — | A | 28 | excellent |
| Example 35 | 6500 | 4.4 | 2.12 | 0.21 | 1.91 | excellent | — | A | 52 | excellent |
| Example 36 | 12000 | 3.4 | 2.14 | 0.21 | 1.93 | excellent | — | A | 51 | excellent |
| Example 37 | 6250 | 3.1 | 1.73 | 0.16 | 1.57 | excellent | — | A | 41 | excellent |
| Example 38 | 6000 | 4.7 | 1.81 | 0.15 | 1.66 | excellent | — | A | 42 | excellent |
| Example 39 | 6250 | 4.1 | 2.14 | 0.19 | 1.95 | excellent | — | A | 42 | excellent |
| Example 40 | 6250 | 3.1 | 0.83 | 0.21 | 0.62 | excellent | — | A | 64 | good |
| Example 41 | 5000 | 4.9 | 1.89 | 0.16 | 1.73 | good | — | A | 67 | excellent |
| Comparative Example 1 | 17.5 | 1.1 | 0.23 | 0.20 | 0.03 | good | good | — | 225 | bad |
| Comparative Example 2 | 16800 | 1.7 | 0.32 | 0.32 | 0.00 | worse | — | B | 310 | worse |
| Comparative Example 3 | 17250 | 1.7 | 0.46 | 0.30 | 0.16 | good | — | B | 205 | bad |
| Comparative Example 4 | 16500 | 1.7 | 0.58 | 0.30 | 0.28 | good | — | B | 156 | bad |
| Comparative Example 5 | 17000 | 1.7 | 1.91 | 0.16 | 1.75 | bad | — | B | 216 | excellent |
| Comparative Example 6 | 17300 | 1.7 | 0.93 | 0.21 | 0.72 | bad | — | B | 232 | good |

DESCRIPTION OF SYMBOLS

1: Semiconductor substrate
2: n-type impurity-diffusing composition
3: n-type impurity diffusion layer
4: p-type impurity-diffusing composition
5: p-type impurity diffusion layer
6: Barrier coating
6a: Barrier coating opening
7: n-type contact electrode
8: p-type contact electrode
9: Interdigitated back-contact solar cell
30: Stripe coating apparatus
31: Semiconductor substrate
32: Stage
33: Linear drive (X direction)
34: Linear drive (Y direction)
35: Bracket
36: CCD camera
37: Height sensor
38: Nozzle
40: Semiconductor substrate
41: Nozzle
42: Discharge port
43: Paste
44: Bead
45: Manifold
46: Pressure port
47: Paste supply port
51: p-type silicon wafer
52: n-type impurity-diffusing composition
53: n-type impurity diffusion layer
54: p-type impurity-diffusing composition
55: p-type impurity diffusion layer
61: p-type silicon wafer
62: n-type impurity-diffusing composition
63: n-type impurity diffusion layer
64: p-type impurity-diffusing composition
65: p-type impurity diffusion layer The impurity-diffusing composition of the present invention can be used for photovoltaic devices, such as solar batteries, as well as semiconductor devices obtained by patterning an impurity diffusion region on a semiconductor surface, such as transistor arrays, diode arrays, photodiode arrays, and transducers.

The invention claimed is:
1. A impurity-diffusing composition, comprising:
(A) a polysiloxane represented by Formula (1); and
(B) an impurity diffusion component:

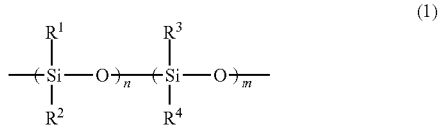

(1)

wherein $R^1$ represents an aryl group having 6 to 15 carbon atoms, and a plurality of $R^1$ may be the same or different; $R^2$ represents any of a hydroxyl group, an alkyl group having 1 to 6 carbon atoms, an alkoxy group having 1 to 6 carbon atoms, an acyloxy group having 1 to 6 carbon atoms, an alkenyl group having 2 to 10 carbon atoms, and an aryl group having 6 to 15 carbon atoms, and a plurality of $R^2$ may be the same or different; $R^3$ and $R^4$ each represent any of a hydroxyl group, an alkyl group having 1 to 6 carbon atoms, an alkoxy group having 1 to 6 carbon atoms, an acyloxy group having 1 to 6 carbon atoms, and an alkenyl group having 2 to 10 carbon atoms, and a plurality of $R^3$ and a plurality of $R^4$ each may be the same or different; and the ratio of n:m is 95:5 to 25:75.

2. The impurity-diffusing composition according to claim 1, wherein $R^2$ and $R^4$ each represent any of a hydroxyl group, an alkoxy group having 1 to 6 carbon atoms, and an acyloxy group having 1 to 6 carbon atoms, and $R^3$ is an alkyl group having 1 to 4 carbon atoms or an alkenyl group having 2 to 4 carbon atoms.

3. The impurity-diffusing composition according to claim 1, wherein the ratio of n:m is 80:20 to 40:60.

4. The impurity-diffusing composition according to claim 1, wherein (A) the polysiloxane has a 20% pyrolysis temperature of 550° C. or higher.

5. The impurity-diffusing composition according to claim 1, further comprising (C) a thickener in an amount of 3% by weight to 20% by weight based on the amount of the composition.

6. The impurity-diffusing composition according to claim 1, which is applied onto a semiconductor substrate by printing in order to form a diffusion layer on the substrate.

7. The impurity-diffusing composition according to claim 6, wherein the printing is screen printing.

8. A method of manufacturing a semiconductor device, comprising the steps of:
   printing the impurity-diffusing composition according to claim 1 on a semiconductor substrate to form a impurity-diffusing composition film; and
   diffusing impurities from the impurity-diffusing composition film to form an impurity diffusion layer.

9. The method of manufacturing a semiconductor device according to claim 8, wherein the impurity-diffusing composition film is a pattern of the impurity-diffusing composition.

10. The method of manufacturing a semiconductor device according to claim 8, wherein the printing is screen printing.

* * * * *